US010901318B2

(12) United States Patent
Kiyotomi

(10) Patent No.: US 10,901,318 B2
(45) Date of Patent: *Jan. 26, 2021

(54) SUBSTRATE PROCESSING APPARATUS, METHOD OF ADJUSTING PARAMETERS OF COATING MODULE, AND STORAGE MEDIUM

(71) Applicant: TOKYO ELECTRON LIMITED, Tokyo (JP)

(72) Inventor: Akiko Kiyotomi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/860,606

(22) Filed: Apr. 28, 2020

(65) Prior Publication Data

US 2020/0257201 A1    Aug. 13, 2020

Related U.S. Application Data

(63) Continuation of application No. 16/193,349, filed on Nov. 16, 2018, now Pat. No. 10,670,966.

(30) Foreign Application Priority Data

Nov. 20, 2017    (JP) .................................. 2017-222929

(51) Int. Cl.
*G03F 7/16* (2006.01)
*H01L 21/66* (2006.01)
*G03F 7/42* (2006.01)

(52) U.S. Cl.
CPC .............. *G03F 7/16* (2013.01); *G03F 7/162* (2013.01); *G03F 7/168* (2013.01); *G03F 7/42* (2013.01); *H01L 22/20* (2013.01); *H01L 22/12* (2013.01)

(58) Field of Classification Search
None
See application file for complete search history.

(56) References Cited

U.S. PATENT DOCUMENTS

2007/0082134 A1* 4/2007 Fukuda ............... H01L 21/6715
427/337
2008/0131599 A1* 6/2008 Sato ........................ G03F 7/162
427/240

(Continued)

FOREIGN PATENT DOCUMENTS

JP       2016-147246 A    8/2016
JP       2017-150849 A    8/2017

*Primary Examiner* — Ali Naraghi
(74) *Attorney, Agent, or Firm* — Nath, Goldberg & Meyer; Jerald L. Meyer

(57) ABSTRACT

An apparatus includes: a coating module for applying a coating liquid to each wafer and discharging a removing liquid from a nozzle toward a beveled portion of the wafer under rotation; an imaging module; and a controller for controlling: the imaging module to image outer end and rear surfaces of the wafer; obtaining a height dimension of an outer edge of a coating film with respect to an inner edge of the beveled portion based on the imaging result; determining whether or not the obtained dimension is an allowable value; if the result is negative, resetting the number of revolutions of the wafer based on the obtained dimension and a first reference data; controlling the coating module to again perform the application and removal operations; performing the determination process; and if the result is positive, storing the reset number of revolutions in a storage part.

16 Claims, 17 Drawing Sheets

(56) References Cited

U.S. PATENT DOCUMENTS

2018/0088466 A1* 3/2018 Kawakami ................ G03F 7/11
2019/0155158 A1* 5/2019 Kiyotomi .................. G03F 7/42
2019/0287796 A1* 9/2019 Noda ...................... H01L 22/20

* cited by examiner

SUBSTRATE PROCESSING APPARATUS, METHOD OF ADJUSTING PARAMETERS OF COATING MODULE, AND STORAGE MEDIUM

CROSS-REFERENCE TO RELATED APPLICATION

This is a Continuation Application of U.S. patent application Ser. No. 16/193,349, filed Nov. 16, 2018, an application claiming the benefit from Japanese Patent Application No. 2017-222929, filed on Nov. 20, 2017, the contents of each of which are hereby incorporated by reference in their entirety.

TECHNICAL FIELD

The present disclosure relates to a technique of adjusting parameters used in a coating module which forms a coating film on a semiconductor wafer and subsequently, removes the coating film formed on a beveled portion or peripheral portion of the semiconductor wafer with a removing liquid.

BACKGROUND

As one of the processes performed in photolithography of forming a coating film pattern on a semiconductor wafer (hereinafter, referred to as a wafer) as a substrate, there is a process of forming a coating film on a front surface of the wafer. In a coating module that performs such a process, for example, a coating liquid is supplied onto a central portion of the wafer which is rotating while being mounted on a spin chuck so that a coating film is formed on the wafer. When the coating film is formed on the surface of the wafer in this manner, there may be a case where an end portion of the coating film is removed to remove an unnecessary film in a peripheral portion of the coating in a ring shape or a rear surface of the wafer is cleaned by the coating module. The removal of the end portion of the coating film is performed by locally discharging a solvent of the coating film from a nozzle to the peripheral portion of the wafer which is rotating by the spin chuck. The cleaning of the rear surface is performed by discharging a cleaning liquid from a cleaning nozzle toward the rear surface of the wafer which is rotating by the spin chuck.

In such a coating module, when a new coating liquid or cleaning liquid is used, an adjustment operation is carried out in advance on parameters that may affect the removal of the end portion of the coating film or the cleaning of the rear surface prior to actually processing a semiconductor wafer as a product. Conventionally, after a predetermined process is performed on a wafer for parameter adjustment in the coating module, the respective wafer is transferred to an inspection apparatus such as, e.g., a microscope or the like. In this inspection apparatus, the front surface or the rear surface of the wafer is observed to recognize a cutting state or a cleaning state of the end portion of the coating film, and change values of the parameters based on the recognized state. Then, a predetermined process is again performed in the coating module using the changed parameters, and thereafter, an inspection is conducted in the inspection apparatus to adjust the parameters. That is to say, the adjustment was made in a trial and error manner. Therefore, it takes a lot of time and labor and an experienced operator is needed to adjust the parameters, which is a complicated work.

For example, a technique has been used to set parameters within an appropriate range by approximating a film thickness distribution to a linear function and a quadratic function which indicate a relationship between a position and a film thickness of the substrate, and changing the parameters for adjusting the film thickness of the coating film based on these functions. However, this technique does not take into consideration parameters which may affect the cutting state of the end portion of the coating film or the cleaning state of the rear surface of the wafer.

Further, there is another technique which images an end portion surface of the substrate to obtain a shape data of the end portion surface, recognizes an amount of warping of the substrate, and determines a supply position of a solvent based on the warp amount, when removing an unnecessary film by supplying the solvent to a peripheral portion of a coating film after forming the coating film. However, this technique does not adjust parameters by recognizing the cutting state of the end portion of the coating film or the cleaning state of the rear surface of the substrate.

SUMMARY

Some embodiments of the present disclosure provide a technique capable of easily adjusting parameters by automatically adjusting parameters of a coating module when forming a coating film on a semiconductor wafer and subsequently, removing the coating film formed on a beveled portion or peripheral portion of the semiconductor wafer by the coating module.

According to one embodiment of the present disclosure, there is provided a substrate processing apparatus for forming a coating film on a semiconductor wafer, including: a loading/unloading block into and from which a transfer container configured to accommodate a plurality of semiconductor wafers is loaded and unloaded; a coating module configured to apply a coating liquid to each of the plurality of semiconductor wafers taken out of the transfer container loaded into the loading/unloading block, and subsequently, in a state where the semiconductor wafer is rotated, discharge a removing liquid from a beveled portion film removing nozzle toward a beveled portion of the semiconductor wafer to remove the coating film formed on the beveled portion; an imaging module including an imaging part configured to image the semiconductor water; a semiconductor wafer transfer mechanism configured to transfer the semiconductor wafer between the coating module and the imaging module; a storage part; and a controller configured to: control the imaging module to image an outer end surface and a rear surface of the semiconductor wafer selected for a parameter adjustment among the plurality of semiconductor wafers, which is processed by the coating module; obtain a height dimension of an outer edge of the coating film with respect to an inner edge of the beveled portion of the semiconductor wafer based on an imaging result obtained by the imaging module; determine whether or not the obtained height dimension is a first allowable value; if the obtained height dimension is determined to be not the first allowable value, reset the number of revolutions of the semiconductor wafer based on the obtained height dimension and a first reference data indicating a relationship between a previously-prepared height dimension and a previously-prepared number of revolutions of the semiconductor wafer; control the coating module to again perform the application of the coating liquid onto the semiconductor wafer for the parameter adjustment and the removal of the coating film formed on the beveled portion; subsequently, determine whether the obtained height dimension is the first allowable value; and if the obtained height dimension is determined to be the first allowable value, store the reset number of revolutions of the semiconductor wafer in the storage part as a parameter for processing the semiconductor wafer as a product.

According to another embodiment of the present disclosure, there is provided a substrate processing apparatus for forming a coating film on a semiconductor wafer, including: a loading/unloading block into and from which a transfer container configured to accommodate a plurality of semiconductor wafers is loaded and unloaded; at least one coating module configured to apply a coating liquid to each of the plurality of semiconductor wafers taken out of the transfer container loaded into the loading/unloading block, and subsequently, in a state where the semiconductor wafer is rotated, discharge a removing liquid from a peripheral portion film removing nozzle toward a front surface inward of a beveled portion of the semiconductor wafer to remove the coating film formed on the peripheral portion; an imaging module including an imaging part, configured to image the semiconductor wafer; a semiconductor wafer transfer mechanism configured to transfer the semiconductor wafer between the at least one coating module and the imaging module; a storage part; and a controller configured to: control the imaging module to image the front surface of the semiconductor wafer selected for a parameter adjustment among the plurality of semiconductor wafers, which is processed by the at least one coating module; obtain a degree of disturbance of a cut surface from an outer edge of the coating film to an inner edge of the beveled portion of the semiconductor wafer based on an imaging result obtained by the imaging module; determine whether or not the obtained degree of disturbance of the cut surface is a first allowable value; if the obtained degree of disturbance of the cut surface is determined to be not the first allowable value, reset a coating film drying time based on the obtained degree of disturbance of the cut surface and a first reference data indicating a relationship between a previously-prepared degree of disturbance of the cut surface and a previously-prepared coating film drying time required to dry the coating film prior to removing the coating film formed on the peripheral portion; control the at least one coating module to again perform the application of the coating liquid onto the semiconductor wafer for the parameter adjustment and the removal of the coating film formed on the peripheral portion; subsequently, determine whether or not the obtained degree of disturbance of the cut surface is the first allowable value; and if the obtained degree of disturbance of the cut surface is determined to be the first allowable value, store the reset coating film drying time in the storage part as a parameter for processing the semiconductor wafer as a product.

According to another embodiment of the present disclosure, there is provided a method of adjusting a parameter during processing of a coating module in a substrate processing apparatus for forming a coating film on a semiconductor wafer, wherein the apparatus includes: a loading/unloading block into and from which a transfer container configured to accommodate a plurality of semiconductor wafers is loaded and unloaded; a coating module configured to apply a coating liquid to each of the plurality of semiconductor wafers taken out of the transfer container loaded into the loading/unloading block, and subsequently, in a state where the semiconductor wafer is rotated, discharge a removing liquid from a beveled portion film removing nozzle toward a beveled portion of the semiconductor wafer to remove the coating film formed on the beveled portion; an imaging module including an imaging part configured to image the semiconductor wafer; a semiconductor wafer transfer mechanism configured to transfer the semiconductor wafer between the coating module and the imaging module; and a storage part, the method comprising: imaging, by the imaging module, an outer end surface and a rear surface of the semiconductor wafer selected for a parameter adjustment among the plurality of semiconductor wafers, which is processed by the coating module; obtaining a height dimension of an outer edge of the coating film with respect to an inner edge of the beveled portion of the semiconductor wafer based on an imaging result obtained by the imaging module; determining whether or not the obtained height dimension is a first allowable value; if the obtained height dimension is determined to be not the first allowable value, resetting the number of revolutions of the semiconductor wafer based on the obtained height dimension and a first reference data indicating a relationship between a previously-prepared height dimension and a previously-prepared number of revolutions of the semiconductor wafer; controlling the coating module to again perform the application of the coating liquid onto the semiconductor wafer for the parameter adjustment and the removal of the coating film formed on the beveled portion; subsequently, determining whether or not the obtained height dimension is the first allowable value; and if the obtained height dimension is determined to be the first allowable value, storing the reset number of revolutions of the semiconductor wafer in the storage part as the parameter for processing the semiconductor wafer as a product.

According to another embodiment of the present disclosure, there is provided a method of adjusting a parameter during processing of a coating module in a substrate processing apparatus for forming a coating film on a semiconductor wafer, wherein the apparatus includes: a loading/unloading block into and from which a transfer container configured to accommodate a plurality of semiconductor wafers is loaded and unloaded; at least one coating module configured to apply a coating liquid to each of the plurality of semiconductor wafers taken out of the transfer container loaded into the loading/unloading block, and subsequently, in a state where the semiconductor wafer is rotated, discharge a removing liquid from a peripheral portion film removing nozzle toward a front surface inward of a beveled portion of the semiconductor wafer to remove the coating film formed on the peripheral portion; an imaging module including an imaging part configured to image the semiconductor wafer; a semiconductor wafer transfer mechanism configured to transfer the semiconductor wafer between the at least one coating module and the imaging module; and a storage part, the method comprising: controlling the imaging module to image the front surface of the semiconductor wafer selected for a parameter adjustment among the plurality of semiconductor wafers, which is processed by the at least one coating module; obtaining a degree of disturbance of a cut surface from an outer edge of the coating film to an inner edge of the beveled portion of the semiconductor wafer based on an imaging result obtained by the imaging module; determining whether or not the obtained degree of disturbance of the cut surface is a first allowable value; if the obtained degree of disturbance of the cut surface is determined to be not the first allowable value, resetting a coating film drying time based on the obtained degree of disturbance of the cut surface and a first reference data indicating a relationship between a previously-prepared degree of disturbance of the cut surface and a previously-prepared coating film drying time required to dry the coating film prior to the removal of the coating film formed on the peripheral portion; controlling the at least one coating module to again perform the application of the coating liquid onto the semiconductor wafer for the parameter adjustment and the removal of the coating film formed on the peripheral portion; subsequently, determining whether or not the obtained degree of disturbance of the cut surface is the first allowable value; and if the obtained degree of disturbance of the cut surface is determined to be the first allowable value, storing the reset coating film drying time in the storage part as the parameter for processing the semiconductor wafer as a product.

According to another embodiment of the present disclosure, there is provided a non-transitory computer-readable recording medium storing a computer program for use in a substrate processing apparatus for forming a coating film on a semiconductor wafer, the apparatus comprising: a loading/unloading block into and from which a transfer container configured to accommodate a plurality of semiconductor wafers is loaded and unloaded; a coating module configured to apply a coating liquid to each of the plurality of semiconductor wafers taken out of the transfer container loaded into the loading/unloading block; an imaging module including an imaging part configured to image the semiconductor wafer; and a semiconductor wafer transfer mechanism configured to transfer the semiconductor wafer between the coating module and the imaging module, wherein the computer program includes a group of steps for executing the aforementioned method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
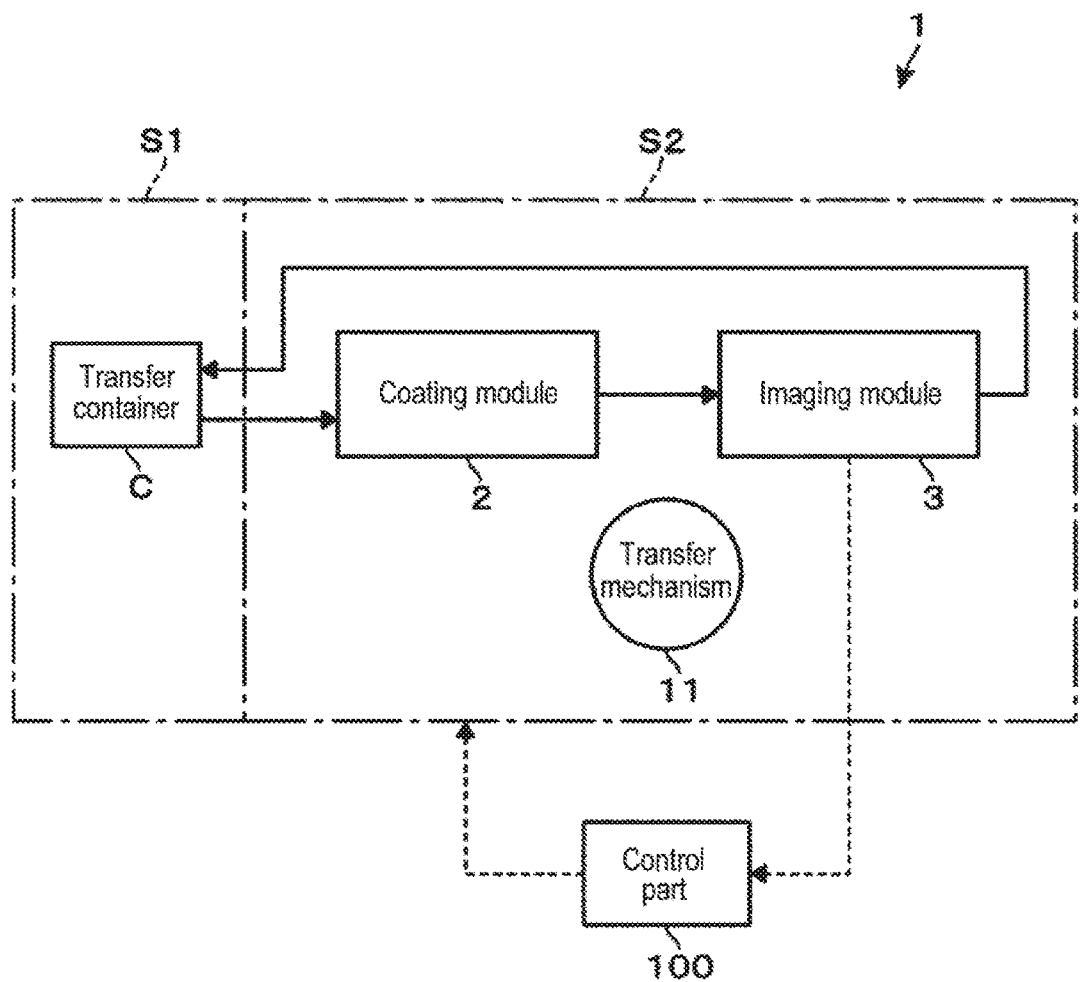
FIG. 1 is a configuration diagram illustrating a major part of one embodiment of a substrate processing apparatus according to the present disclosure.

FIG. 1 illustrates a schematic configuration of a coating/developing apparatus 1 constituting a substrate processing apparatus according to the present disclosure. The coating/developing apparatus 1 includes a loading/unloading block S1 into and from which a transfer container C configured to accommodate and transfer a plurality of wafers W is loaded and unloaded, and a processing block S2. A coating module 2 for applying a coating liquid to the wafers W and an imaging module 3 for imaging the wafers W are installed inside the processing block S2. The wafers are transferred between the transfer container C and the coating module 2 and the imaging module 3 by a transfer mechanism 11 constituting a semiconductor wafer transfer mechanism.

A wafer W for parameter adjustment s picked up from the transfer container C and is transferred to the coating module 2. In the coating module 2, the application of the coating liquid, removal of a coating film formed on a beveled portion and cleaning of a rear surface of the wafer W are performed. Subsequently, the wafer W is transferred to the imaging module 3 where an outer end surface and the rear surface of the wafer W are imaged. Then, based on the imaging results, the number of revolutions (the number of rinsing revolutions) during the removal of the coating film in the beveled portion and a cleaning time taken for the cleaning of the rear surface, which are parameters of the coating module 2, are automatically adjusted by a control part 100. Hereinafter, a process of removing the coating film in the beveled portion will be described as a beveled portion cleaning process.

Figure 2:
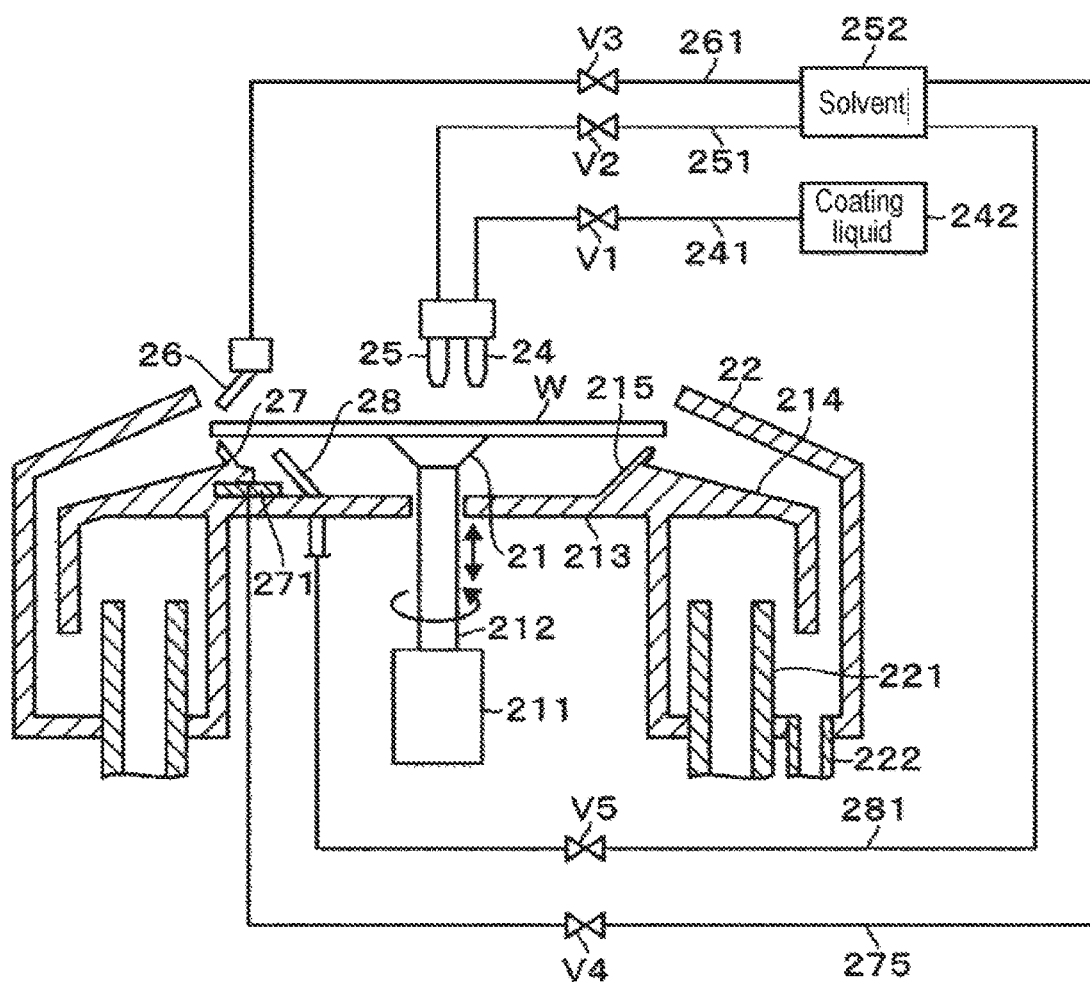
FIG. 2 is a longitudinal cross-sectional view illustrating a coating module.
Figure 3:
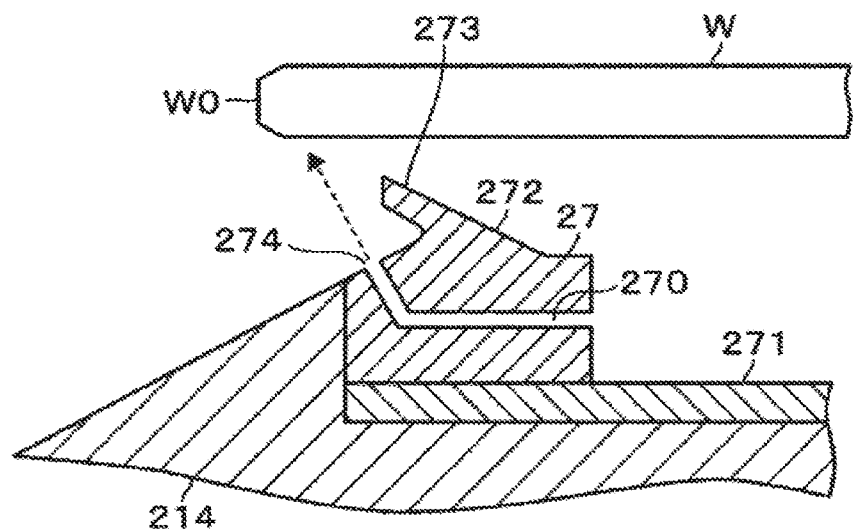
FIG. 3 is a partial longitudinal cross-sectional view illustrating a beveled portion cleaning nozzle.

Next, one embodiment of the coating module 2 will be described with reference to FIGS. 2 and 3. In FIGS. 2 and 3, reference numeral 21 is a spin chuck serving as a substrate holding part that holds and rotates the wafer W. The spin chuck 21 is configured to hold the wafer W in a horizontal posture by adsorbing a central portion of the rear surface of the wafer W. Further, the spin chuck 21 is configured to be rotatable around a vertical axis, for example, in a clockwise direction when viewed from the top and movable up and down, by a driving mechanism 211 through a shaft 212.

A cup 22 is installed around the wafer W held by the spin chuck 21. A lower portion of the cup 22 is exhausted through an exhaust pipe 221 and is connected to a liquid drain pipe 222. In addition, a circular plate 213 is installed below the spin chuck 21 so as to surround the shaft 212. A ring-shaped mountain-like member 214 having a mountain-like section shape is formed around the circular plate 213. A projection 215 for suppressing inflow of mist flowing inside the cup 22 to the side of the rear surface of the wafer is formed at the top of the mountain-like member 214.

The coating module 2 includes a coating liquid nozzle 24 for discharging the coating liquid and a solvent nozzle 25 for discharging a solvent of the coating liquid. The coating liquid nozzle 24 is coupled to a coating liquid supply mechanism 242 via a flow path 241 in which an opening/closing valve V1 is installed. The solvent nozzle 25 is a nozzle used for pre-process performed prior to discharging the coating liquid to the wafer W. The solvent nozzle 25 is coupled to a solvent supply mechanism 252 via a flow path 251 in which an opening/closing valve V2. The coating liquid nozzle 24 and the solvent nozzle 25 are configured to be movable between above the central portion of the wafer W and a retreat position defined outside the cup 22 by a movement mechanism (not shown).

In addition, the coating module 2 includes a removing liquid nozzle 26 that is a nozzle for removing a film formed on a peripheral portion of the wafer W, a beveled portion cleaning nozzle 27 for removing a film formed on the beveled portion, and a rear surface cleaning nozzle 25. The removing liquid nozzle 26 discharges a removing liquid to the surface of the wafer W inward of the beveled portion of the wafer W held by the spin chuck 21 so that the removing liquid is directed to the downstream side of the wafer W in the rotation direction. The removing liquid nozzle 26 is formed in, for example, a straight tube shape. A leading end of the removing liquid nozzle 26 is opened as a discharge port of the removing liquid. The removing liquid nozzle 26 is configured to be movable, for example, between a processing position where the removing liquid is discharged to the peripheral portion of the wafer and a retreat position defined outside the cup 22 by a movement mechanism (not shown).

Furthermore, the beveled portion cleaning nozzle 27 is provided to discharge a removing liquid toward the beveled portion at the side of the rear side of the wafer W supported by the spin chuck 21. The beveled portion cleaning nozzle 27 is configured to be movable along a base 271. The base 271 is installed in, for example, a notch portion (not shown) formed in the mountain-like member 214. In addition, as illustrated in FIG. 3, the beveled portion cleaning nozzle 27 includes an inclined surface portion 272. A tip formed by extending the inclined surface portion 272 constitutes a projection 273. As described above, the beveled portion cleaning nozzle 27 is configured to serve as a portion of the mountain-like member 214, and the projection 273 is configured to serve as a portion of the projection 215 of the mountain-like member 214.

A removing liquid supply passage 270 is formed inside the beveled portion cleaning nozzle 27. The removing liquid is supplied obliquely upward from a discharge port 274 formed in a leading end of the removing liquid supply passage 270. For example, when the removing liquid is discharged toward the wafer W, it is set such that the removing liquid reaches a beveled portion W0, specifically such that a reaching point of the removing liquid on the wafer W falls within a range of, e.g., 0 to 4.5 mm, inward from the outer edge of the wafer W.

The rear surface cleaning nozzle 28 is provided to discharge a cleaning liquid to the rear surface of the wafer W inward of the beveled portion W0 of the wafer W held by the spin chuck 21. For example, when the cleaning liquid is discharged toward the wafer W, it is set such that a reaching point of the cleaning liquid on the wafer W falls within, e.g., 70 mm, inward from the outer edge of the wafer W. For example, two beveled portion cleaning nozzles 27 and two rear surface cleaning nozzles 28 are respectively installed at, for example, positions diametrically facing each other, on the circular plate 213 in the coating module 2 (see FIGS. 5 and 6).

In this embodiment, both the removing liquid and the cleaning liquid are solvents of the coating film. The removing liquid nozzle 26 is coupled to, for example, the solvent supply mechanism 252, via a flow path 261 in which an opening/closing valve V3 is installed. The beveled portion cleaning nozzle 27 is coupled to, for example, the solvent supply mechanism 252 via a flow path 275 in which an opening/closing valve V4 is installed. Furthermore, the rear surface cleaning nozzle 28 is coupled to, for example, the solvent supply mechanism 252 via a flow path 281 in which an opening/closing valve V5 is installed.

Figure 4:
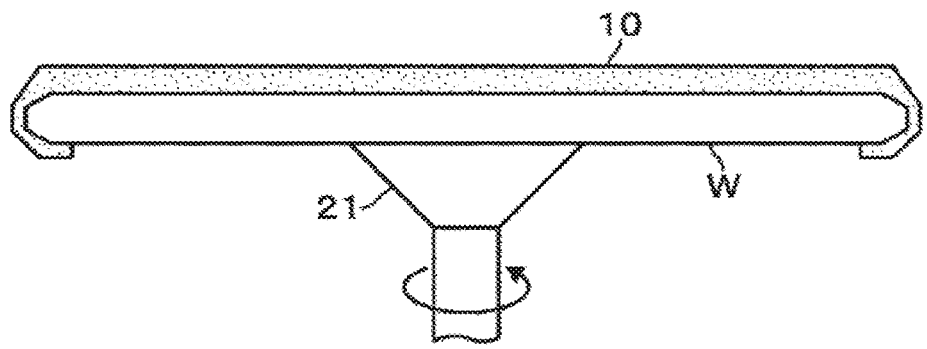
FIG. 4 is a process view illustrating an operation of a coating module according to a first embodiment of the present disclosure.

An example of the process performed by the coating module 2 will be described with reference to FIGS. 4 to 7. First, the wafer W is transferred to and mounted on the spin chuck 21 by the transfer mechanism 11. The solvent is discharged from the solvent nozzle 25 onto the central portion of the wafer W. The solvent is applied on the entire front surface of the wafer W by virtue of a centrifugal force generated by rotating the wafer W. Subsequently, in the state where the wafer W is rotated, the coating liquid, for example, a resist liquid, is discharged from the coating liquid nozzle 24 onto the central portion of the rotating wafer W. The coating liquid is applied on the entire front surface of the wafer W by virtue of the centrifugal force. Thereafter, a liquid film is dried by rotating the wafer W for a predetermined period of time. In this way, a coating film 10 is formed (FIG. 4).

Figure 5:
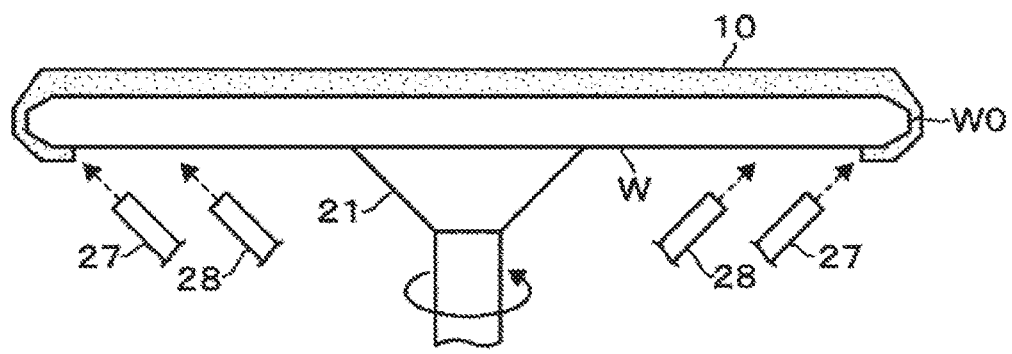
FIG. 5 is a process view illustrating an operation of the coating module according to the first embodiment.
Figure 6:
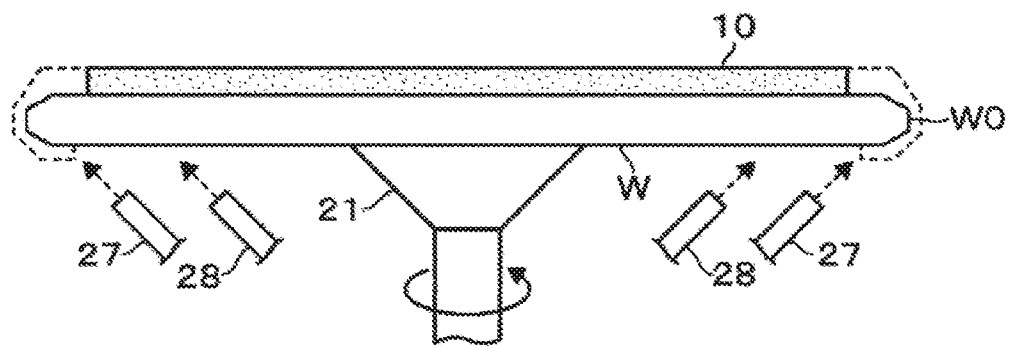
FIG. 6 is a process view illustrating an operation of the coating module according to the first embodiment.

Subsequently, the cleaning of the bevel portion and the rear surface are performed. In this embodiment, as illustrated in FIGS. 5 and 6, for example, the removing liquid and the cleaning liquid are simultaneously discharged from the beveled portion cleaning nozzles 27 and the rear surface cleaning nozzles 28 toward the wafer W while rotating the wafer W. Accordingly, the removing liquid (solvent) discharged from the beveled portion cleaning nozzle 27 is biased outward of the wafer W by virtue of the centrifugal force of the wafer W and goes around the beveled portion W0 to the side of the front surface of the wafer. In a region to which the removing liquid is supplied, the coating film is softened and dissolved by the removing liquid, and is pushed out outward of the wafer W by virtue of the centrifugal force. Thus, the coating film is removed. At this time, the removing liquid hardly goes around the front surface of the wafer as the number of revolutions (number of rinsing revolutions) of the wafer W increases. When the removing liquid goes too around the front surface, the coating film formed onward of a desired region may be removed. Meanwhile, when the amount of the removing liquid which goes around the front surface is too small, the coating film may remain on the beveled portion W0.

Figure 12:
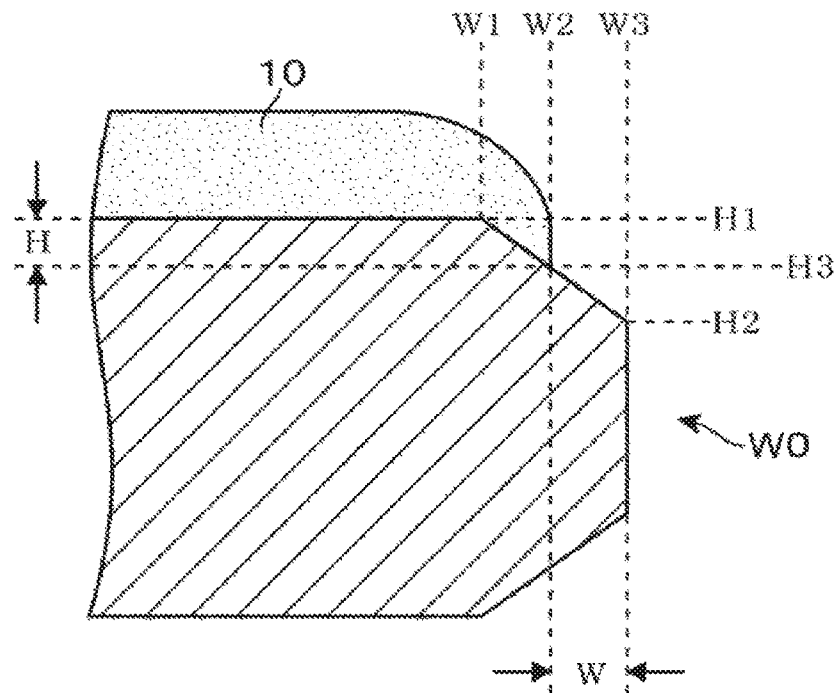
FIG. 12 is a partial longitudinal cross-sectional view illustrating a beveled portion of a wafer.

In the present embodiment, as will be described later, the number of rinsing revolutions is adjusted by obtaining a cutting height. A cutting height H denotes a height dimension of an outer edge of the coating film with respect to an inner edge of the beveled portion W0 of the wafer W, as illustrated in FIG. 12 which will be described later. As illustrated in FIG. 12, a distance between an outer edge of the wafer (an outer edge of the beveled portion W0) and the outer edge of the coating film in the lateral direction is assumed to be a cutting width W. It is difficult for the removing liquid to go around the front surface of the wafer as the number of rinsing revolutions increases. Thus, the cutting width W of the coating film in the end portion of the wafer decreases and the cutting height H increases. As described above, the cutting height and the cutting width have a correlation with each other.

Figure 7:
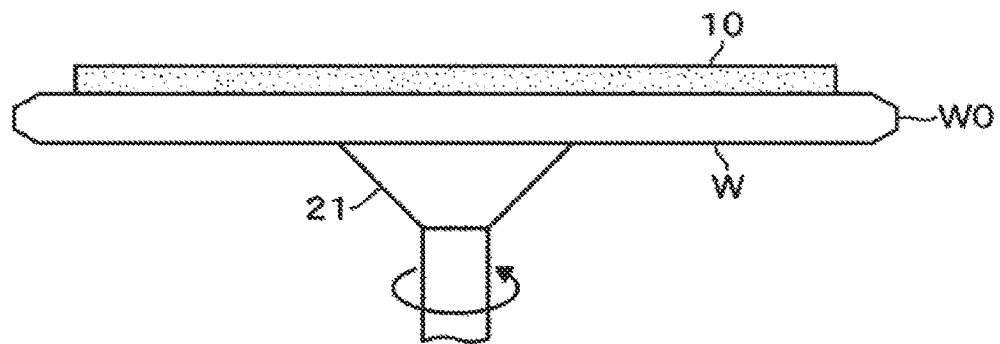
FIG. 7 is a process view illustrating an operation of the coating module according to the first embodiment.

Turning back to FIG. 6 and continuing the description, the contamination caused by the coating liquid adhering to the rear surface of the wafer W is removed by the cleaning liquid (solvent) discharged from the rear surface cleaning nozzles 28. The coating film dissolved thus is prevented from going around the rear surface and adhering to the rear surface. In such a rear surface cleaning, the longer the cleaning time, the less a film residue which represents a degree of contamination caused by the coating liquid in the rear surface of the wafer (hereinafter, referred to as "degree of contamination"). After the cleaning the beveled portion and the rear surface are performed in this manner, as illustrated in FIG. 7, the discharge of the removing liquid from the beveled portion cleaning nozzles 27 and the discharge of the cleaning liquid from the rear surface cleaning nozzles 28 are respectively stopped. Subsequently, the removing liquid and the cleaning liquid existing on the wafer W are shake-off dried by rotating the wafer W, and the process performed in the coating module 2 is completed.

Figure 8:
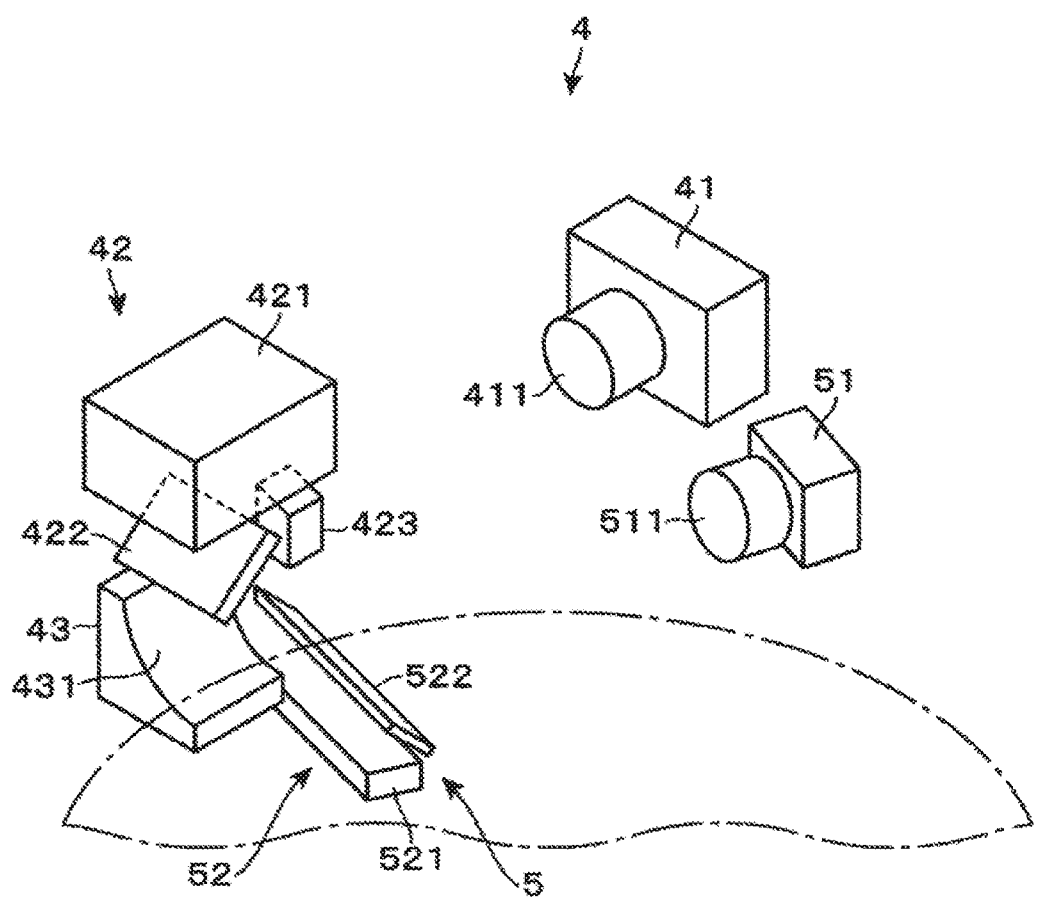
FIG. 8 is a schematic perspective view illustrating an imaging module.
Figure 9:
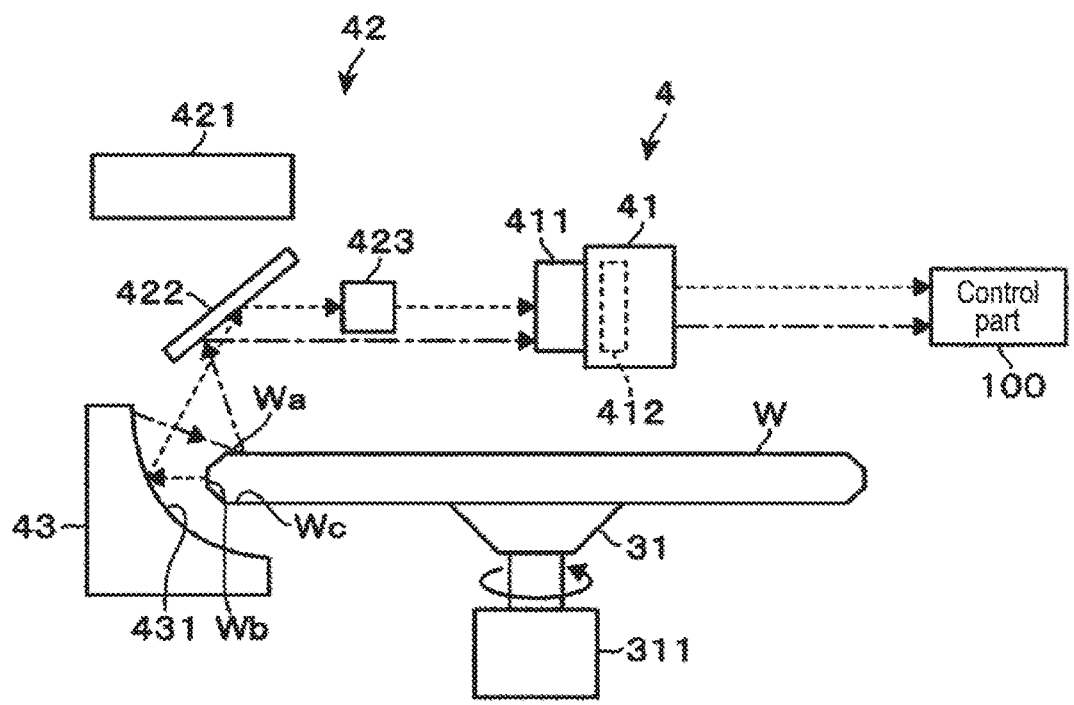
FIG. 9 is a configuration diagram schematically illustrating an operation of the imaging module.
Figure 10:
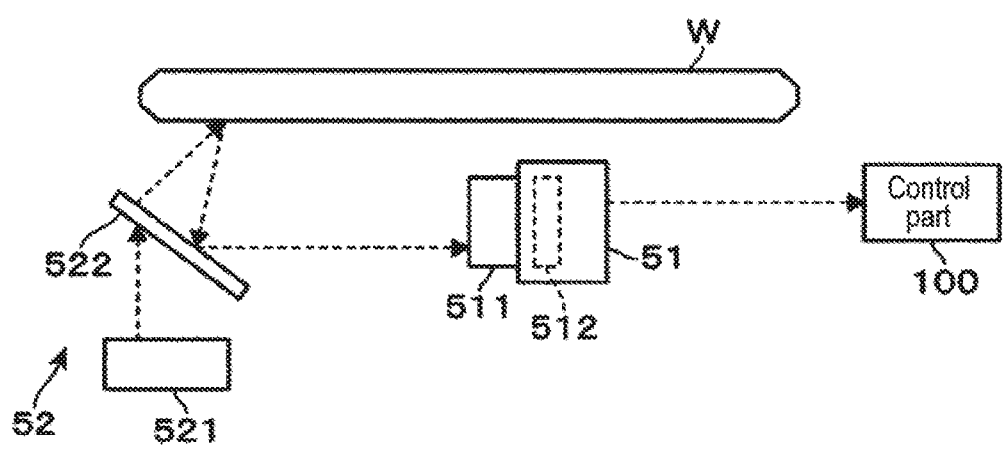
FIG. 10 is a configuration diagram schematically illustrating an operation of the imaging module.

Next, the imaging module 3 will be described with reference to FIGS. 8 to 10. FIG. 8 is a schematic perspective view illustrating major parts of the imaging module 3, and FIGS. 9 and 10 schematically illustrate the major parts to illustrate an operation of the imaging module 3. The imaging module 3 is provided to image an outer end surface and the rear surface of the wafer W. The imaging module 3 includes a holding table 31 which holds the wafer W in a horizontal posture and is configured to rotate around a vertical axis by a rotary mechanism 311. The rotary mechanism 311 includes, for example, an encoder for detecting a rotational position of the holding table 31. The rotary mechanism 311 is configured to associate an imaging position and a rotational position of each surface of the wafer W obtained by a peripheral edge imaging part 4 and a rear surface imaging part 5 (both to be described later) with one another.

The peripheral edge imaging part 4 is provided to simultaneously image, for example, a peripheral region Wa of the front surface of the wafer W and an outer end surface Wb (the beveled portion W0) of the wafer W. As illustrated in FIGS. 8 and 9, the peripheral edge imaging part 4 includes a camera 41 as an imaging means, an illumination part 42, and a mirror member 43. The camera 41 and the illumination part 42 are installed to face each other. The camera 41 includes a lens 411 and an imaging element 412 configured as, for example, a CCD image sensor.

The illumination part 42 includes a light source 421, a half mirror 422, and a focus adjustment lens 423, which are disposed above the wafer W held by the holding table 31. The half mirror 422 is formed in, for example, a rectangular shape, and is arranged to be inclined by approximately 45 degrees with respect to the horizontal direction. The focus adjustment lens 423 has a function of changing a synthetic focal length with the lens 411.

The peripheral edge imaging part 4 includes a mirror member 43. The mirror member 43 is disposed below the half mirror 422 and is installed to face the outer end surface Wb of the wafer W held by the holding table 31 and a peripheral region of the rear surface of the wafer W. A portion of the mirror member 43 which faces the outer end surface Wb and the like of the wafer We is formed as a curved concave surface which is depressed to be spaced apart by a predetermined distance from the outer end surface Wb of the wafer W held by the holding table 31. The curved concave surface is, for example, a reflective surface 431 which is subjected to a mirroring treatment.

In the illumination part 42, light emitted from the light source 421 passes through the half mirror 422 and is irradiated downward. A diffused light that has passed through the half mirror 422 is reflected at the reflective surface 431 of the mirror member 43. A reflected light, which is obtained by reflecting the diffused light at the reflective surface 431, is mainly irradiated to the outer end surface Wb of the wafer W and the peripheral region Wa of the front surface of the wafer W. A reflected light reflected off the peripheral region Wa of the front surface of the wafer W is again reflected at the half mirror 422, as indicated by an alternate long and short dash line in FIG. 9. This reflected light passes through the lens 411 of the camera 41 without passing through the focus adjustment lens 423 and is incident on the imaging element 412. Meanwhile, a reflected light reflected off the outer end surface Wb of the wafer W is reflected at the reflective surface 431 of the mirror member 43 and the half mirror 422 in this order, as indicated by a dotted line in FIG. 9, and sequentially passes through the focus adjustment lens 423 and the lens 411 and is incident on the imaging element 412.

As described above, since both the light originated from the peripheral region Wa of the front surface of the wafer W and the light originated from the outer end surface Wb of the wafer W are inputted to the imaging element 412 of the camera 41, the camera 41 can capture both the peripheral region Wa of the front surface of the wafer W and the outer end surface Wb of the wafer W. Data of images captured by the camera 41 is transmitted to, for example, the control part 100.

As illustrated in FIGS. 8 and 10, the rear surface imaging part 5 includes a camera 51 and an illumination part 52. The camera 51 serves as an imaging means which includes a lens 511 and an imaging element 512 configured as, for example, a CCD image sensor. The camera 51 and the illumination part 52 are installed so as to face each other. The illumination part 52 is disposed below the water W held by the holding table 31, and includes a light source 521 and a half mirror 522. The half mirror 522 is formed in, for example, a rectangular shape, and is arranged to be inclined by approximately 45 degrees with respect to the horizontal direction. Light emitted from the light source 521 positioned below the half mirror 522 entirely passes through the half mirror 522 and is oriented upward. Light that has passed through the half mirror 522 is reflected at the rear surface of the wafer W, is then reflected again at the half mirror 522, passes through the lens 511 of the camera 51, and is incident on the imaging element 512. In this manner, data of a captured image of the rear surface of the wafer W, which is captured by the imaging element 512, is transmitted to, for example, the control part 100.

In the imaging module 3, based on a control signal provided from the control part 100, the holding table 31 on which the wafer W is mounted is rotated by the rotary mechanism 311. In this state, in the peripheral edge imaging part 4 and the rear surface imaging part 5, the light sources 421 and 521 are respectively turned on so that the imaging operations of the cameras 41 and 51 are performed. In this manner, the peripheral region Wa of the front surface of the wafer W, the outer end surface Wb of the wafer W, and the rear surface Wc of the wafer W are imaged over the entire peripheral edge of the wafer W. When the wafer W is rotated once and the imaging by the cameras 41 and 51 is completed, the data of images captured by the cameras 41 and 51 is transmitted to the control part 100 as described hereinbelow.

Figure 11:
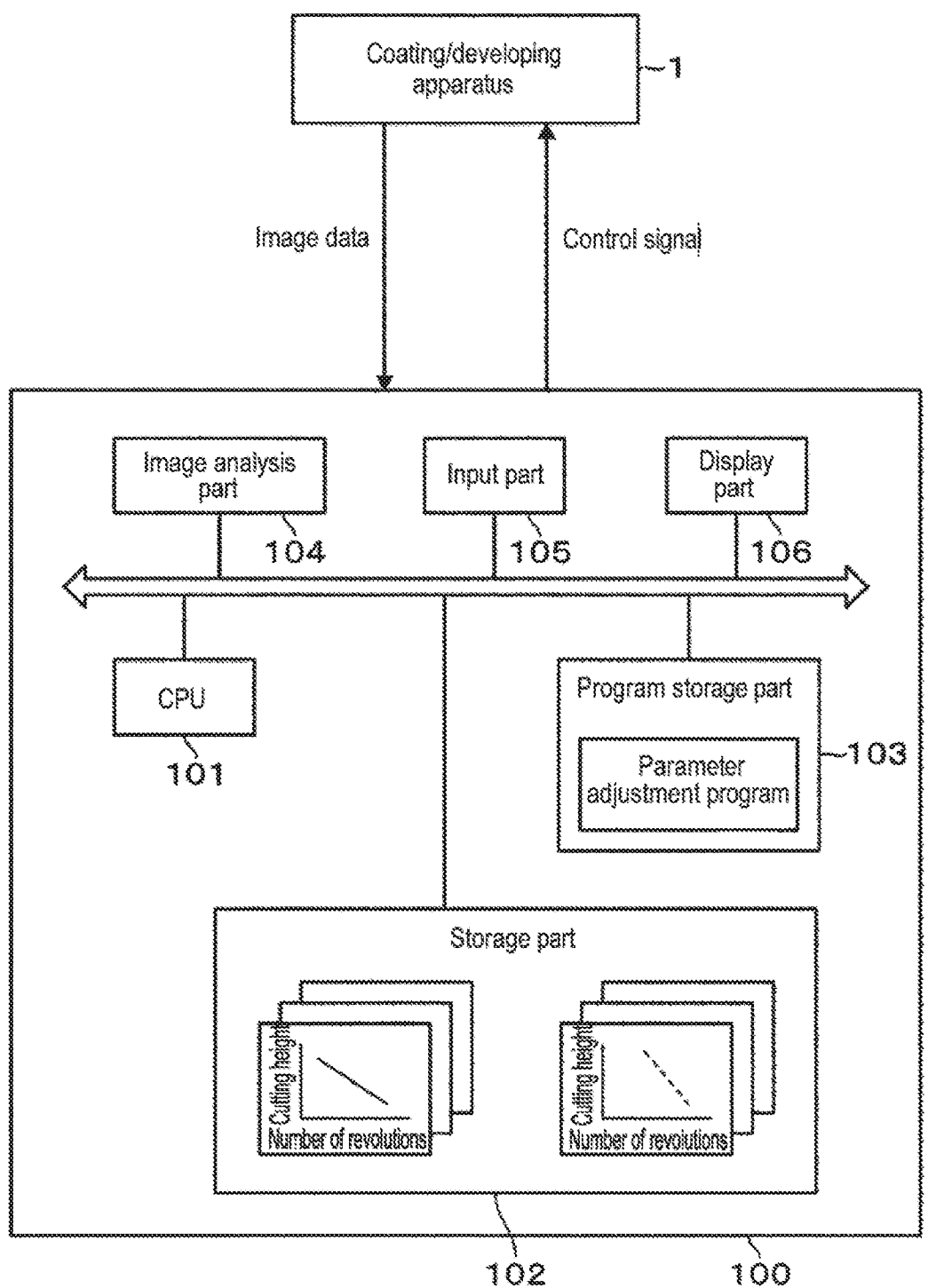
FIG. 11 is a configuration diagram illustrating a control part of a substrate processing apparatus.

The coating/developing apparatus 1 includes the control part 100. As illustrated in FIG. 11, for example, the control part 100 includes a CPU 101, a storage part 102, a program storage part 103 configured as a computer, an image analysis part 104, an input part 105, and a display part 106. A program having instructions (a group of steps) for performing a coating film forming process and a parameter adjustment as described hereinbelow is stored in the program storage part 103. By this program, control signals are outputted from the control part 100 to respective parts of the coating/developing apparatus 1, whereby the operations of the respective parts of the coating/developing apparatus 1 are controlled. This program is stored in the program storage part in a state of being stored in a storage medium such as, e.g., a hard disk, a compact disc, a magneto-optical disc, a memory card or the like.

Various recipes related to a process performed by the coating/developing apparatus 1 are stored in the storage part 102. For the parameter adjustment, for example, imaging results captured by the imaging module 3, a recipe performed in the coating module 2, a reference data and an actual data (to be described later) and the like are stored in the storage part 102. The image analysis part 104 has a function of obtaining a cutting height and a degree of contamination of the rear surface of the wafer based on the imaging results (image data) captured by the imaging module 3. A method of obtaining a cutting height from the imaging results will be described later. For example, in a case of adjusting the parameters, the input part 105 has a function of inputting a target value or the like of the cutting height. In a case where a plurality of coating modules 2 is provided, the input part 105 has a function of selecting, among the plurality of coating modules 2, a coating module 2 for adjustment, and a recipe to be performed by the respective coating module 2, or the like. In the case of adjusting the parameters, the display part 106 has a function of, for example, displaying results of parameter adjustment or the like.

Various programs stored in the program storage part 103 also include a parameter adjustment program. The parameter adjustment program has a function of determining whether or not the cutting height obtained based on the imaging result of the wafer W is an allowable value, and if it is not an allowable value, resetting the number of revolutions of the beveled portion cleaning process (the number of rinsing revolutions) based on the obtained cutting height and a reference data of the respective cutting height. The reference data of the cutting height is data indicating a relationship between the cutting height and the number of rinsing revolutions which are prepared in advance. For example, the reference data of the cutting height is data previously acquired by using a resist different from one being currently processed or a cleaning liquid different from one being currently used.

In addition, the parameter adjustment program has a function of again performing the application of the coating liquid and the cleaning of the beveled portion with respect to the wafer for adjustment by using the coating module 2 based on the reset number of rinsing revolutions. Thereafter, the parameter adjustment program has a function of determining whether or not the cutting height obtained from the imaging result is an allowable value in the same manner, and if it is an allowable value, storing the reset number of rinsing revolutions in the storage part 102 as a parameter (hereinafter, referred to as a "parameter for processing") used when processing a semiconductor wafer as a product (hereinafter, referred to as a "product wafer").

Furthermore, in addition to the function of determining the cutting height, the parameter adjustment program of this example has a function of determining whether or not the degree of contamination obtained based on the imaging result of the wafer W is an allowable value, and if it is not an allowable value, resetting the cleaning time based on the obtained degree of contamination and a reference data of the degree of contamination. The reference data of the degree of contamination is data indicating a relationship between the degree of contamination and the cleaning time of the rear surface of the wafer (hereinafter, simply referred to as "cleaning time") which are prepared in advance. For example, the in addition to the function of determining the cutting height is data previously acquired by using a resist different from one being currently processed or a cleaning liquid different from one being currently used.

In addition, the parameter adjustment program has a function of performing the application of the coating liquid, the cleaning of the beveled portion and the cleaning of the rear surface with respect to the wafer W for adjustment by using the coating module 2 during the reset cleaning time. Thereafter, the parameter adjustment program has a function of determining whether or not the degree of contamination obtained from the imaging result is an allowable value in the same manner, and if it is an allowable value, storing the reset cleaning time in the storage part 102 as a parameter for process.

Furthermore, when a first series of operations and a second series of operations are performed and subsequently, a third series of operations are further performed, the parameter adjustment program is configured to reset the number of rinsing revolutions with an actual data instead of the reference data. Here, the series of operations are operations of obtaining the cutting height and determining whether or not the obtained cutting height is an allowable value after performing the application of the coating liquid and the cleaning of the beveled portion with respect to the wafer W for adjustment by the coating module 2. In addition, the actual data is data indicating a relationship between a cutting height and the number of rinsing revolutions obtained from a first cutting height and the first number of rinsing revolutions acquired in the first series of operations and a second cutting height and the second number of rinsing revolutions acquired in the second series of operations.

Furthermore, when the first series of operations and the second series of operations are performed and subsequently, the third series of operations is performed, the parameter adjustment program is configured to reset the cleaning time with an actual data instead of the reference data. The actual data is data indicating a relationship between a degree of contamination and a cleaning time obtained from a first degree of contamination and a first cleaning time acquired in the first series of operations and a second degree of contamination and a second cleaning time acquired in the second series of operations. Also, the series of operations are operations of performing the application of the coating liquid and the cleaning of the rear surface with respect to the wafer W for adjustment, obtaining the degree of contamination and determining whether or not the degree of contamination is an allowable value by the coating module 2.

Furthermore, when an n-th (where n is a preset natural number of 3 or more) series of operations are completed and values (the cutting height and the degree of contamination) obtained based on the imaging result exceed an allowable value, the parameter adjustment program is configured to stop a subsequent operation.

Figure 13:
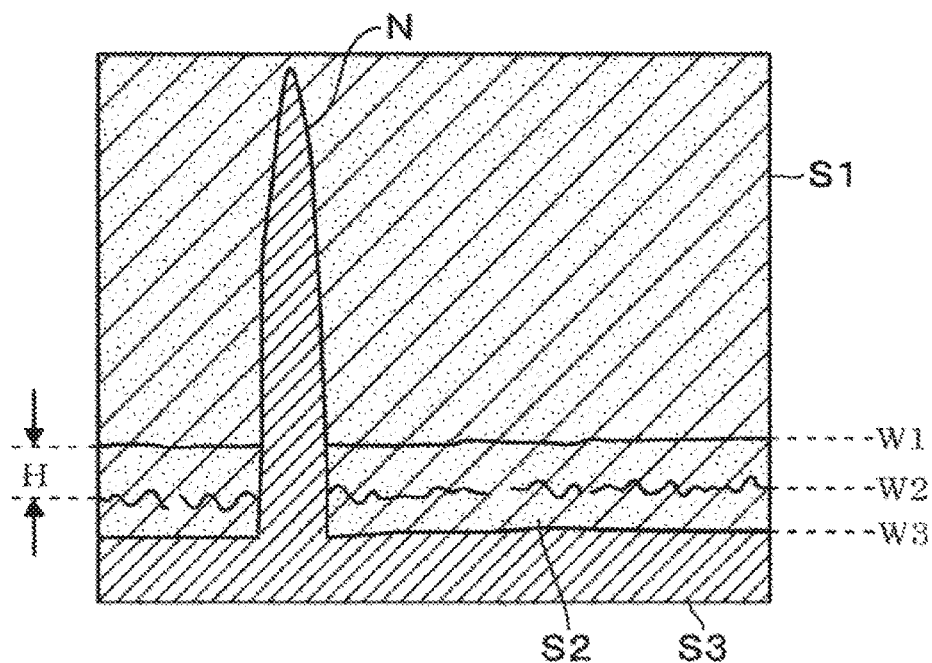
FIG. 13 is a plan view schematically illustrating an imaging result.
Figure 14:
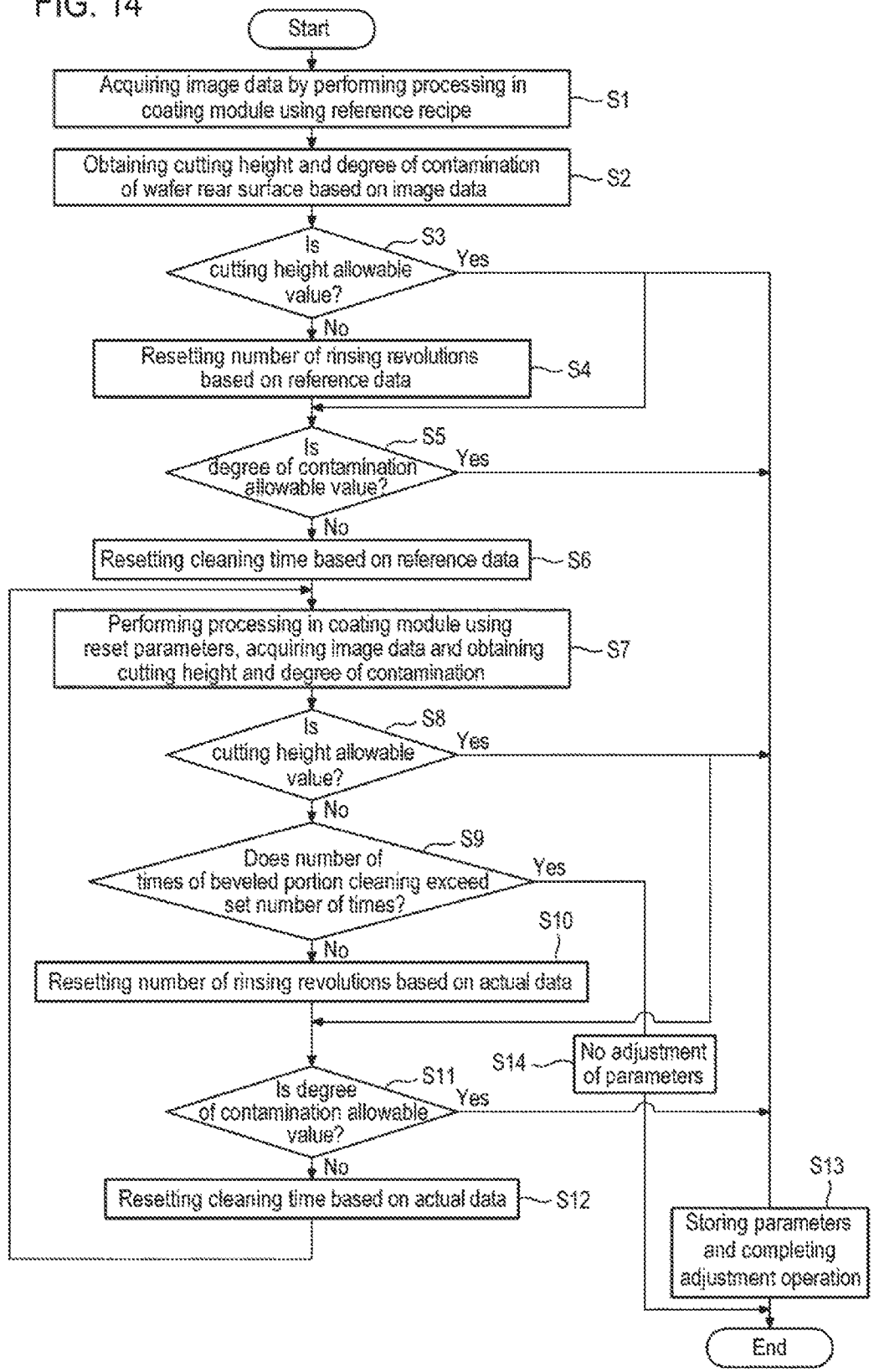
FIG. 14 is a flowchart illustrating an operation of the coating module according to the first embodiment.

An example of a method of obtaining a cutting height from the imaging result by the image analysis part 104 will be described with reference to FIGS. 12 and 13 by way of example. FIG. 12 is a longitudinal cross-sectional view of the beveled portion W0 of the wafer W and FIG. 13 schematically illustrates an image data of the peripheral region Wa of the front surface of the wafer W, which is captured by the peripheral edge imaging part 4 of the imaging module 3. In FIG. 12, reference symbol H1 is a height position of the inner edge of the beveled portion W0, reference symbol H2 is a height position of the outer edge of the beveled portion W0. In FIG. 13, reference symbol N is a notch portion. Further, reference symbol H3 is a height position of the outer edge of the coating film 10 (a height position of the boundary between a region where the coating film 10 is formed and the beveled portion W0).

In FIG. 13, for example, reference symbol S1 indicates a region where the coating film is formed, reference symbol S2 indicates a region where the coating film is not formed (the front surface of the wafer), and reference symbol S3 indicates a region where there is no inspection object such as the notch portion of the water. These regions S1 to S3 are indicated to have different contrasts. In FIGS. 12 and 13, reference symbol W1 is a boundary position between the beveled portion and the front surface of the wafer W, reference symbol W2 is a cut position, and reference symbol W3 is a wafer outer end position. Due to the differences in contrast, the positions W1 and W2 are detected from the image data. As described above, the cutting height H is a height dimension of the outer edge of the coating film with respect to the inner edge of the beveled portion W0 and has a correlation with an absolute value of (W1−W2). Thus, the cutting position is calculated from (W1−W2). The image analysis part 104 acquires data on cutting heights at 360 positions of the water W in the circumferential direction from, for example, the image data, and obtains their average value as the cutting height H.

Furthermore, the image analysis part 104 recognizes a region to where a film residue adheres on the image data of the outer end surface and the rear surface of the wafer, which is captured by the peripheral edge imaging part 4 and the rear surface imaging part 5 of the imaging module 3, for example, using the differences in contrast. From this, a degree of contamination of the rear surface of the wafer W, which is caused by the coating liquid, is obtained. The example illustrated in FIG. 13 is also given r understanding of the present disclosure. A state in which the coating film is gone around the side of the rear surface of the wafer W is recognized from the image data of the rear surface. Therefore, in an actual case, the cutting height H and the degree of contamination are obtained based on the imaging results of the outer end surface and the rear surface of the wafer, which are captured by the peripheral edge imaging part 4 and the rear surface imaging part 5 of the imaging module 3. Thus, the degree of contamination on the rear surface of the wafer also includes the degree of contamination (the number of defects) on the rear surface of the wafer and the beveled portion.

Next, an automatic adjustment of parameters in the coating module 2, which is performed by the coating/developing apparatus 1 will be described. This automatic adjustment of the parameters is performed in a case where the coating/developing apparatus 1 is started up or is subjected to maintenance, where the type of coating liquid or solvent is changed in the coating module 2, where a new coating liquid, solvent or cleaning liquid is used, or the like. Here, the case where a new coating liquid is used will be described with reference to FIGS. 14 to 17C as an example.

Figure 15:
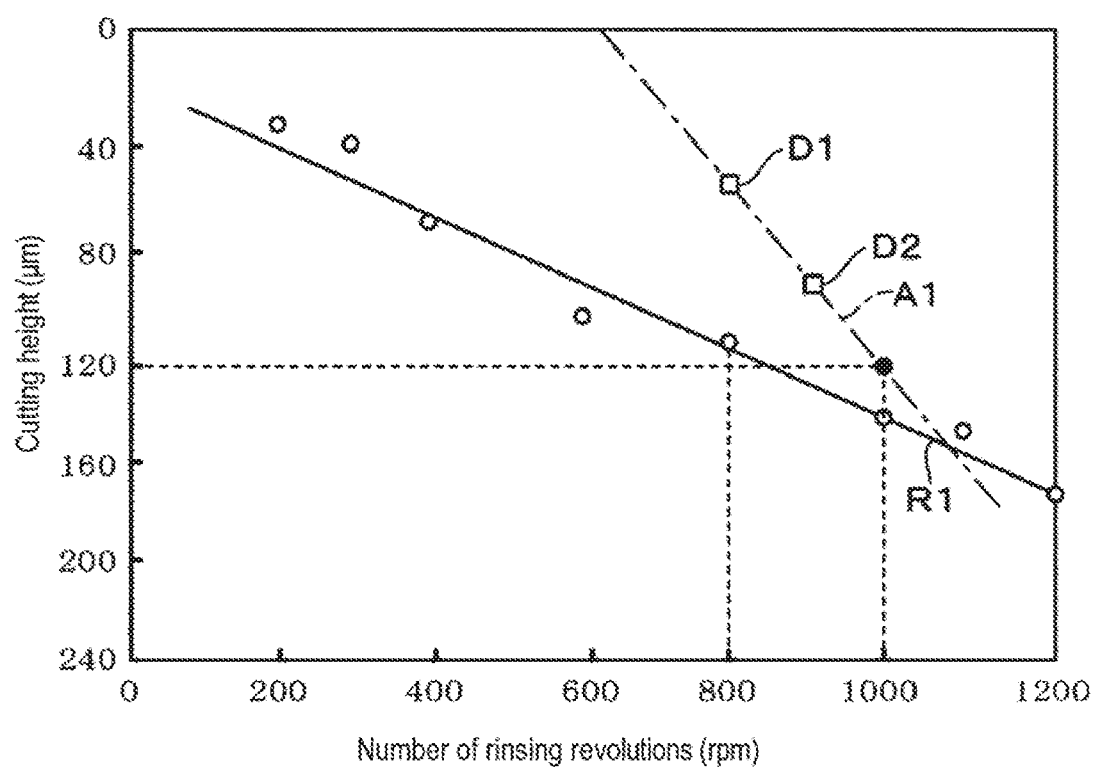
FIG. 15 is a characteristic diagram illustrating a reference data which indicates a relationship between a cutting height and a number of revolutions, and an actual data.
Figure 16:
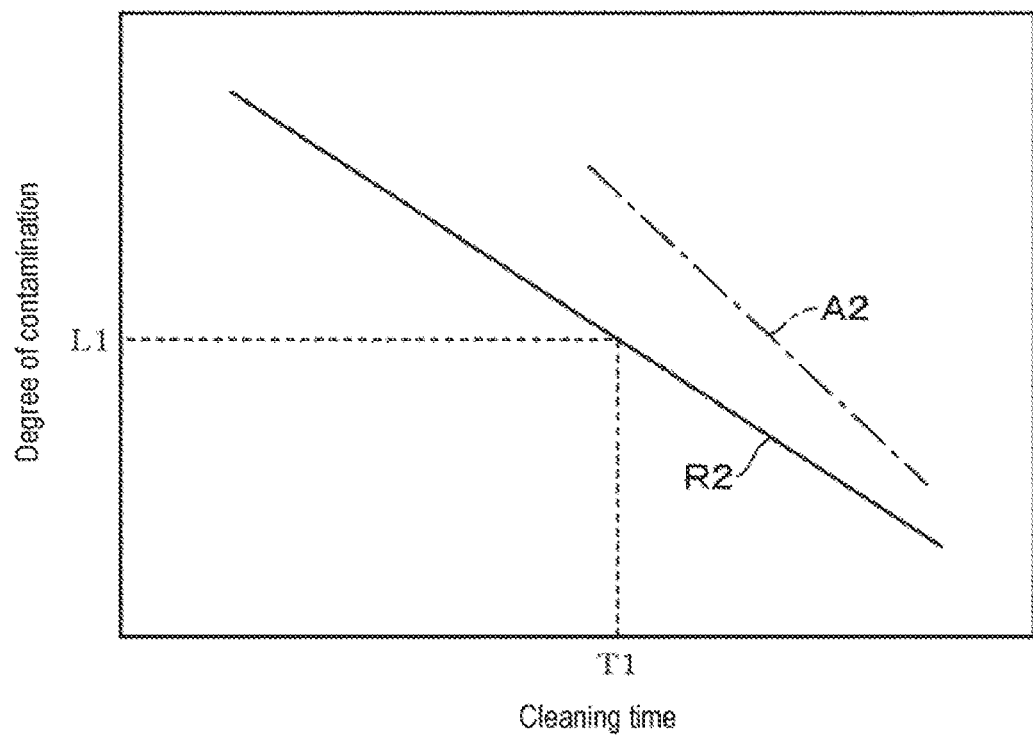
FIG. 16 is a characteristic diagram illustrating a reference data which indicates a relationship between a degree of contamination and a cleaning time, and an actual data.

First, by the input part 105, a coating module 2 for adjustment and a target value of the cutting height are inputted and a reference recipe stored in the storage part 102 is selected. As the reference recipe, for example, a standard recipe used for the automatic parameter adjustment may be prepared, or a recipe using a similar coating liquid may be used. For example, as illustrated in FIG. 15, a reference data R1 indicating a relationship between the cutting height and the number of rinsing revolutions in the beveled portion cleaning is stored in the reference recipe. If the target value of the cutting height is set to, e.g., 120 µm, the number of rinsing revolutions in the reference recipe is set to 800 rpm. Furthermore, for example, as illustrated in FIG. 16, a reference data R2 indicating a relationship between the degree of contamination caused by the coating liquid on the rear surface of the wafer and the cleaning time on the rear surface is stored in the reference recipe. A cleaning time T1 at which the degree of contamination becomes an allowable value L1 is set in the reference recipe.

Then, one wafer W is discharged from the transfer container C that accommodates the wafer for parameter adjustment and is transferred to the coating module 2 to form the coating film as described above. The cleaning of the beveled portion and the cleaning of the rear surface are performed based on the set number of rinsing revolutions of 800 rpm and the cleaning time T1. Subsequently, the wafer W is transferred to the imaging module 3 where image data of the outer end surface and the rear surface of the wafer W is acquired as described above (step S1). The wafer W after imaging is returned to, for example, the respective transfer container C, by the transfer mechanism 11.

Figure 17A:
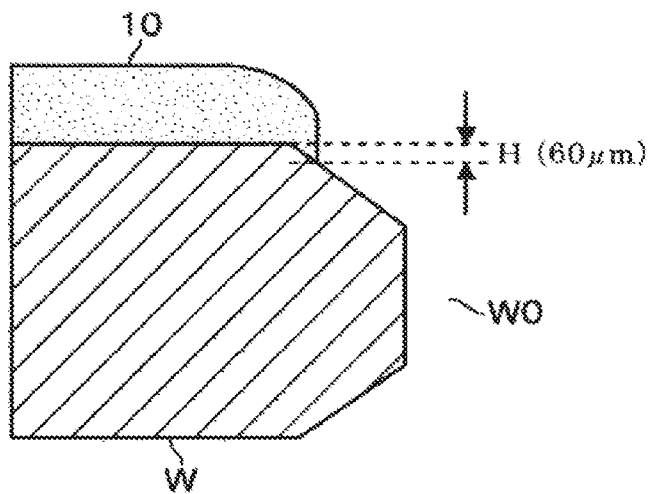
FIGS. 17A to 17C are partial longitudinal cross-sectional views illustrating a beveled portion of a wafer to illustrate a cutting height.

Subsequently, the control part 100 obtains a cutting height and a degree of contamination based on the image data (step S2), and determines whether or not the obtained cutting height is an allowable value (step S1). An allowable value falls within a range of, e.g., ±10% of a target cutting height. Furthermore, this numerical value is illustrated for understanding of the present disclosure but does not represent an example of an actual machine. In this example, as illustrated in FIG. 17A, the cutting height obtained from the image data is set to 60 µm. Accordingly, the process proceeds to step S4 where the number of rinsing revolutions is reset. This resetting is performed based on the reference data R1. Here, based on the reference data R1, the number of rinsing revolutions is reset to, e.g., 900 rpm, to increase the cutting height. On the other hand, if it is determined that the cutting height is an allowable value, the process proceeds to steps S5 and S13. In step S13, the number of rinsing revolutions at this time is stored in the storage part 102 as a parameter to be used when processing the product wafer W. Thereafter, the parameter adjustment operation of the number of rinsing revolutions is ended.

In step S5, it is determined whether or not the degree of contamination is an allowable value. If it is an allowable value, the process proceeds to step S13 where the cleaning time at this time is stored in the storage part 102 as a parameter for processing. Thereafter, the parameter adjustment operation of the cleaning time is terminated. On the other hand, if the degree of contamination exceeds an allowable value, the process proceeds to step S6 where the cleaning time is reset, and the process proceeds to step S7. This resetting is performed based on the reference data R2. The cleaning time is set to be lengthened so as to match the degree of contamination with the allowable value. Here, an example in which the degree of contamination exceeds an allowable value and thus the cleaning time is reset will be described.

In step S7, another wafer W for parameter adjustment is again transferred to the coating module 2. In the coating module 2, the beveled portion cleaning and the rear surface cleaning are performed with a recipe in which the formation of the coating film, the number of rinsing revolutions and the cleaning time are reset. Subsequently, the image data described above is acquired by the imaging module 3 to obtain the cutting height and the degree of contamination. The wafer W after imaging is returned to, for example, the respective transfer container C, by the transfer mechanism 11.

Figure 17B:
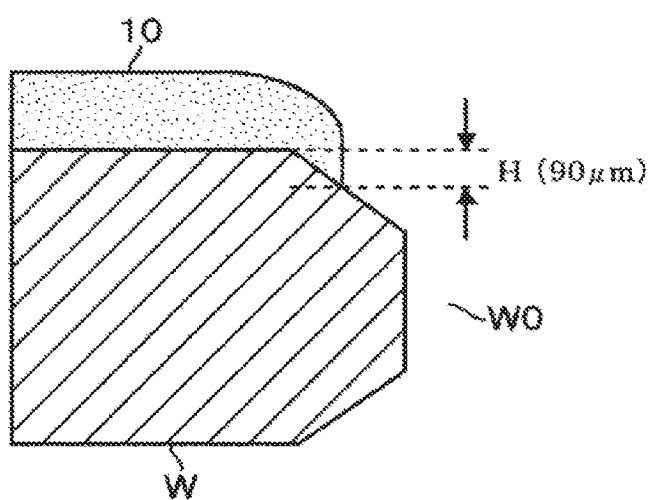

Then, the process proceeds to step S8 where it is determined whether or not the obtained cutting height is an allowable value. In this example, as illustrated in FIG. 17B, the obtained cutting height H is set to 90 µm. Therefore, the process proceeds to step S9 where it is determined whether or not the number of times of the beveled portion cleaning exceeds a set number of times, namely whether or not the series of operations exceed n times which is the set number of times. If the series of operations is determined to have exceed the set number of times, namely if it is determined that the n-th series of operations are completed and the cutting height exceeds an allowable value, the process proceeds to step S14. In step S14, it is determined that the parameter adjustment is impossible, and for example, such an impossible state is displayed on the display part 106. Thereafter, the adjustment operation is terminated. From now on, for example, an operator manually performs the parameter adjustment.

If the number of times of the beveled portion cleaning exceeds the set number of times in step S9, the process proceeds to step S10 where the number of rinsing revolutions is reset. This resetting is performed based on an actual data A1 illustrated in FIG. 15. In FIG. 15, reference symbol D1 is data of the cutting height (60 µm) and the number of rinsing revolutions (800 rpm) in the first series of operations, reference symbol D2 is data of the cutting height (90 µm) and the number of rinsing revolutions (900 rpm) in the second series of operations. The actual data A1 indicating a relationship between the cutting height and the number of rinsing revolutions is obtained based on the data D1 and D2. When the third series of operations are performed, the number of revolutions at which the cutting height becomes 120 µm, in this example, 1,000 rpm, is reset based on the actual data A1. Thereafter, the process proceeds to step S11. On the other hand, if it is determined in step S8 that the cutting height obtained in the second series of operations is an allowable value, the process proceeds to steps S11 and S13. In step S13, the number of rinsing revolutions at that time is stored as a parameter for processing, and the parameter adjustment operation of the number of rinsing revolutions is terminated.

In step S11, it is determined whether or not the degree of contamination is an allowable value. If the degree of contamination is an allowable value, the process proceeds to step S13 where the rinsing time at this time is stored as a parameter for processing, and the parameter adjustment operation of the cleaning time is terminated. On the other hand, if the degree of contamination exceeds an allowable value, the cleaning time is reset in step S12. This resetting is performed based on an actual data A2 (see FIG. 16) indicating a relationship between a degree of contamination and a cleaning time obtained from the degree of contamination and the cleaning time acquired in the first series of operations and the degree of contamination and the cleaning time acquired in the second series of operations.

Subsequently, another wafer W for parameter adjustment is again transferred to the coating module 2 to form a coating film, and a beveled portion cleaning and a rear surface cleaning are performed with a recipe in which the number of rinsing revolutions and the cleaning time are reset. Thereafter, a cutting height and a degree of contamination are obtained from an imaging result of the wafer W (step S7). A value obtained based on the imaging result in this manner becomes data of the cutting height and the degree of contamination acquired in the third series of operations.

Figure 17C:
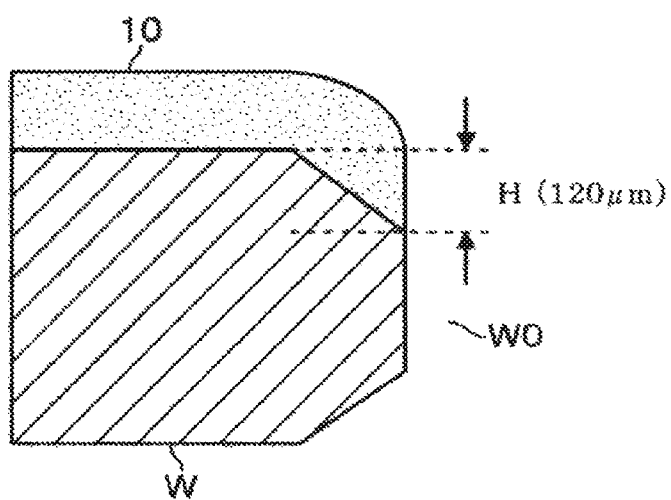

Then, the process proceeds to step S8 where it is determined whether or not the cutting height is an allowable value. In this example, as illustrated in FIG. 17C, the obtained cutting height is assumed to be 120 mm. Therefore, since the cutting height is an allowable value, the process proceeds to steps S11 and S13. In step S13, the reset number of rinsing revolutions is stored as a parameter for processing, and the parameter adjustment operation of the number of rinsing revolutions is terminated. If the cutting height exceeds an allowable value, the process proceeds to step S9 where it is determined whether or not the number of times of beveled portion cleaning exceeds a set number of times. If the number of times of beveled portion cleaning exceeds the set number of times, the number of rinsing revolutions is reset in step S10. This resetting is performed by obtaining an actual data indicating a relationship between the cutting height and the number of rinsing revolutions based on the data (the cutting height and the number of rinsing revolutions) acquired in the first series of operations, the data acquired in the second series of operations, and the data acquired in the third series of operations, and using the actual data thus obtained. In this manner, the number of rinsing revolutions is changed, and the process proceeds to step S11.

In step S11, it is determined whether or not a degree of contamination is an allowable value. If the degree of contamination is an allowable value, the process proceeds to step S13 where the adjustment of parameter of the cleaning time of the rear surface, which is a parameter related to the degree of contamination, is terminated. On the other hand, if the degree of contamination exceeds an allowable value, the cleaning time is reset in step S12. This resetting is performed by obtaining an actual data indicating a relationship between a degree of contamination and a cleaning time based on the data (the degree of contamination and the cleaning time) acquired in the first series of operations, the data acquired in the second series of operations and the data acquired in the third series of operations, and using the actual data thus obtained. In the above description, the actual data may be approximate curves illustrated in FIGS. 15 and 16, or approximate relational expressions.

In this manner, if the cutting height exceeds an allowable value while the number of times of beveled portion cleaning does not exceed the set number of times, a series of operations of resetting the number of rinsing revolutions, followed by again forming the coating film and performing the beveled portion cleaning is performed. Thereafter, the operation of obtaining a cutting height and determining whether or not the cutting height thus obtained is an allowable value is repeated. In addition, if a degree of contamination exceeds an allowable value while the number of times of beveled portion cleaning does not exceed the set number of times, a series of operations of resetting the cleaning time, followed by again forming the coating film and performing the cleaning process is performed. Thereafter, the operation of obtaining a degree of contamination and determining whether or not the degree of contamination thus obtained is an allowable value is repeated.

After the parameter adjustment operation is completed in this manner, processing for a plurality of wafers W is continuously performed by, for example, the coating module 2, based on the parameters stored in the storage part 102 as parameters to be used at the time of the processing. Then, a series of operations of obtaining a cutting height and a degree of contamination by imagining the processed wafer W, followed by determining whether or not they are respective allowable values and confirming the validity of parameters may be performed. At this time, when a problem occurs in the cutting height and the degree of contamination, the parameters may also be automatically adjusted or may be finely adjusted in a manual manner.

According to the aforementioned embodiment, in the coating module 2, a series of operations of applying the coating liquid and performing the beveled portion cleaning on the wafer for adjustment, is performed. The outer end surface and the rear surface of the wafer are imaged. It is determined whether a cutting height obtained based on the imaging result is not an allowable value. If it is determined that the cutting height is not an allowable value, the number of rinsing revolutions is reset based on the reference data. Then, in the coating module 2 again, a coating liquid is applied on the wafer W for adjustment and the beveled portion cleaning is performed. It is determined whether or not a cutting height obtained by imaging the wafer W is an allowable value. If the cutting height is determined to be an allowable value, the reset number of rinsing revolutions is stored in the storage part 102 as a parameter to be used at the time of processing the product wafer W. Accordingly, the setting of the number of rinsing revolutions for determining the cutting height can be automatically performed. Thus, the labor and time required for parameter adjustment is significantly reduced as compared with the case where the operator manually adjusts the number of rinsing revolutions, which facilitates the parameter adjustment operation.

In addition to the operation of determining the cutting height, the operation of determining whether or not the degree of contamination obtained based on the imaging results of the outer end surface and the rear surface of the wafer is an allowable value, is performed. If the degree of contamination is not an allowable value, the operating of resetting the cleaning time is also performed based on the reference data. Then, in the coating module 2 again, the coating liquid is applied on the wafer W for adjustment and the beveled portion cleaning is performed. It is determined whether or not a degree of contamination obtained by imaging the wafer W is an allowable value. If the degree of contamination is determine to be the allowable value, the reset cleaning time is stored in the storage part 102 as a parameter to be used at the time of processing the product wafer V. Accordingly, the setting of the cleaning time for determining the degree of contamination can be automatically performed. This facilitates the parameter adjustment operation as compared with the case where the operator manually adjusts the cleaning time.

In addition, when the first series of operations and the second series of operations are completed and subsequently the third series of operations are further performed, the actual data, instead of the reference data, is used for the resetting of the number of rinsing revolutions or the cleaning time. Thus, the accuracy of the parameters to be reset is improved. Therefore, the time required for parameter adjustment is shortened, which facilities the parameter adjustment operation.

As described above, the transfer of the wafer W from the transfer container C to the coating module 2 and the transfer of the wafer W from the coating module 2 to the imaging module 3 are automatically performed by the transfer mechanism 11, and the resetting of the parameters is automatically performed based on the reference data or the actual data. Thus, it is possible to efficiently perform the parameter adjustment operation. Moreover, since the parameter adjustment operation can be performed without the operator's hands and is not dependent on the experience value of the operator, it is possible to improve the accuracy of the adjustment operation. Furthermore, in the imaging module 3, since the outer end surface and the rear surface of the wafer W can be simultaneously imaged by the peripheral edge imaging part 4 and the rear surface imaging part 5, it is possible to shorten the time required for the adjustment operation. In addition, the number of repetitions of the beveled portion cleaning is set in advance. When the set number of repetitions of the beveled portion cleaning exceeds a predetermined valve and when the cutting height or the degree of contamination is exceeds an allowable value, the adjustment operation is terminated. Thus, even when the automatic parameter adjustment is difficult, the parameter adjustment operation is automatically terminated. It is therefore possible to take subsequent countermeasures at an appropriate timing.

In the above description, in the case where a plurality of coating modules are installed in the coating/developing apparatus 1, the actual data already obtained by another coating module may be used as the reference data used for parameter adjustment in one coating module, for the same type of coating film as the coating film used for parameter adjustment in one coating module. In the case where the plurality of coating modules are installed in the coating/developing apparatus 1, even when there are individual differences in the coating modules due to the automatic adjustment of the parameters, the processing state becomes uniform and thus is effective.

Modification of First Embodiment

In this modification, only the parameter relating to the cutting height applied for the removal of the coating film in the beveled portion may be adjusted. That is to say, the control part 100 may be configured such that the outer end surface and the rear surface of the wafer for adjustment processed in the coating module are imaged by the imaging module, only the cutting height is obtained based on the imaging result, whether or not the obtained cutting height is an allowable value is determined, and if the obtained cutting height is not the allowable value, the number of rinsing revolutions is reset based on the reference data. Further, the control part 100 may be configured such that the application of the coating liquid is performed and the beveled portion cleaning is performed with the reset number of rinsing revolutions by the coating module. In addition, the control part 100 may be configured such that whether or not a cutting height is determined to be an allowable value in the same manner, and if the cutting height is determined to be an allowable value, the reset number of rinsing revolutions is stored in the storage part 102 as a parameter to be used at the time of processing the product wafer W.

For example, by the input part 105, one of the "number of rinsing revolutions and cleaning time" and the "number of rinsing revolutions" may be selected as a parameter to be adjusted in advance, and the adjustment operation described above is performed on the selected parameter. Also, in a case where only the "number of rinsing revolutions" is adjusted, only the application of the coating liquid and the beveled portion cleaning may be performed on the wafer W for adjustment in the coating module. In the aforementioned embodiment, the beveled portion cleaning and the rear surface cleaning are performed at the same time. However, the beveled portion cleaning may be initially performed by discharging the removing liquid from the beveled portion cleaning nozzle 27, followed by stopping the discharge of the removing liquid from the beveled portion cleaning nozzle 27. Thereafter, the rear surface cleaning may be performed by discharging the cleaning liquid from the cleaning nozzle 28. Even in this case, a cutting height and a degree of contamination are obtained by imaging the outer end surface and the rear surface of the wafer W. The adjustment of the number of rinsing revolutions is performed based on the cutting height thus obtained and the adjustment of the cleaning time is performed based on the degree of contamination thus obtained.

Second Embodiment

Figure 18:
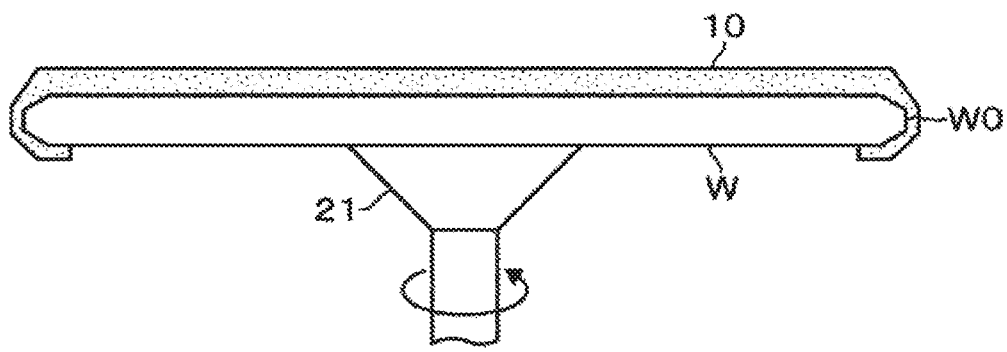
FIG. 18 is a process view illustrating an operation of a coating module according to a second embodiment of the present disclosure.

A second embodiment is an example in which an EBR process for removing a coating film in the peripheral portion with the removing liquid nozzle 26 is performed. A process performed by the coating module 2 in this embodiment will be briefly described with reference to FIGS. 18 to 21. The second embodiment is similar to the first embodiment in that the coating liquid is applied to the wafer W mounted on the spin chuck 21 and subsequently the liquid film is dried by rotating the water W for a predetermined period of time to form the coating film (FIG. 18).

Figure 19:
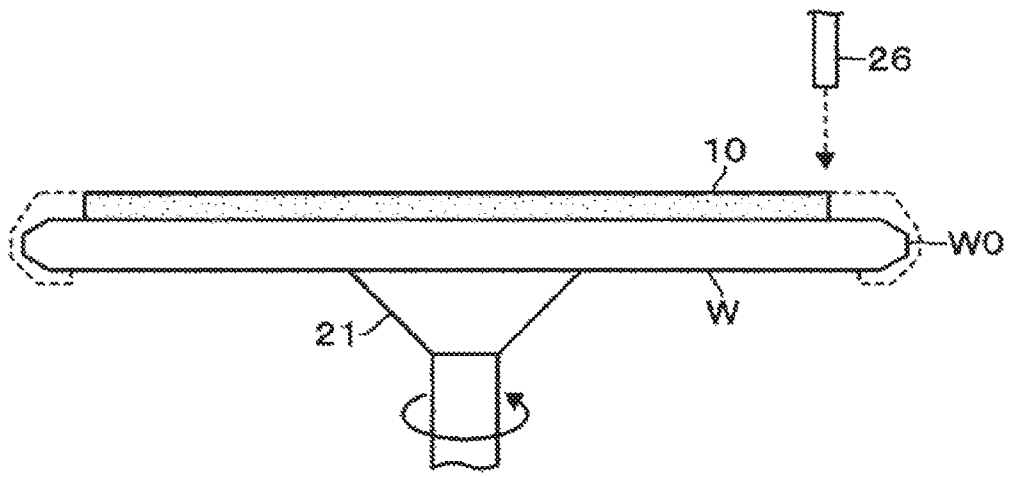
FIG. 19 is a process view illustrating an operation of the coating module according to the second embodiment.

Subsequently, as illustrated in FIG. 19, the EBR process is performed by discharging the removing liquid from the removing liquid nozzle 26 toward a surface inward of the beveled portion W0 in the wafer W while rotating the wafer W. The removing liquid is discharged from the removing liquid nozzle 26 such that it is directed to the downstream side of the wafer W in the rotation direction and such that an extension line of a discharge trace of the removing liquid is directed outward of the peripheral portion of the coating film. By virtue of the centrifugal force generated by the rotation of the water W, the removing liquid quickly flows so as to be pushed out outward of the wafer W. Accordingly, in a region to which the removing liquid is supplied, the coating film is softened and dissolved by the removing liquid. The removing liquid containing components of the dissolved coating film is pushed out outward of the wafer W by virtue of the centrifugal force and is removed. At this time, a cutting width of the coating film in the end portion of the wafer varies depending on the discharge position of the removing liquid discharged from the removing liquid nozzle 26 to the wafer W. In addition, a degree of disturbance of the cut surface varies depending on a drying time performed before the EBR process.

The degree of disturbance of the cut surface refers to how much of the cut surface from the outer edge of the coating film to the inner of the beveled portion is disturbed. For example, a distance from the outer edge of the coating film to the inner edge of the beveled portion is detected at 360 points of the wafer in the circumferential direction. A 3-sigma is obtained from the detected values, and the degree of disturbance of the cut surface is evaluated using a valve of the 3-sigma. The degree of disturbance of the cut surface is obtained based on, for example, an imaging result acquired by imaging the peripheral region Wa of the front surface of the wafer W by the peripheral edge imaging part 4 of the imaging module 3. For example, the distance from the outer edge of the coating film to the inner edge of the beveled portion is acquired as the cutting height H. The degree of disturbance of the cut surface depends on the drying time taken for the drying process of the coating film before the EBR process. Thus, if the drying time is lengthened, the coated film is dried and is difficult to be soluble in the solvent, which alleviates the degree of disturbance of the cut surface.

Figure 20:
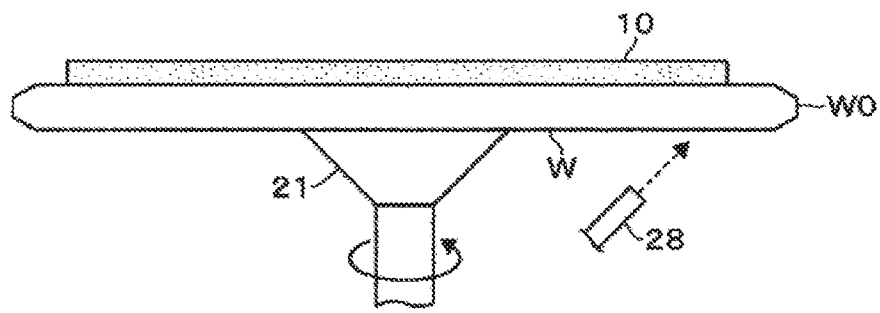
FIG. 20 is a process view illustrating an operation of the coating module according to the second embodiment.
Figure 21:
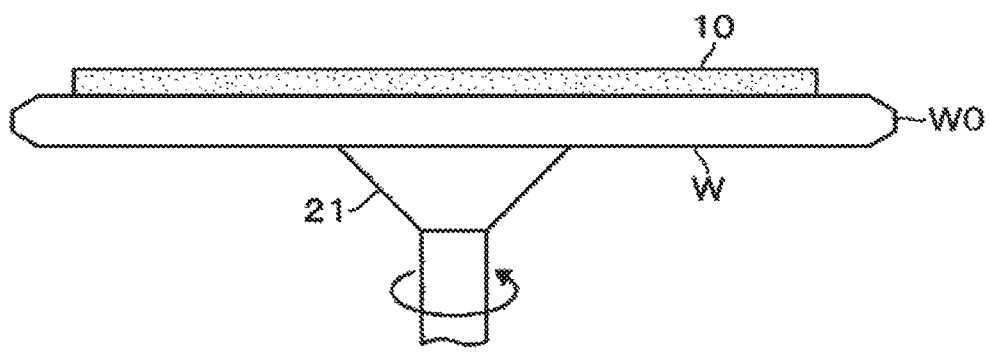
FIG. 21 is a process view illustrating an operation of the coating module according to the second embodiment.

Subsequently, as illustrated in FIG. 20, in a state where the wafer W is rotated, the cleaning liquid is discharged from the rear surface cleaning nozzle 28 toward the rear surface of the wafer W so that the rear surface cleaning is performed. In the rear surface cleaning, as in the first embodiment, the longer the cleaning time, the smaller the degree of contamination. After the EBR process and the rear surface cleaning are performed in this manner, as illustrated in FIG. 21, the discharge of the cleaning liquid from the rear surface cleaning nozzle 28 is stopped, and then the removing liquid and the cleaning liquid existing on the wafer W are shakes off dried by rotating the wafer W.

The control part 100 of the present embodiment is configured to obtain the degree of disturbance of the cut surface from the imaging result of the front surface of the wafer W in the image analysis part 104, and to obtain the degree of contamination from the imaging results of the outer end surface and the rear surface of the wafer W as described above. Furthermore, the parameter adjustment program of this example has a function of adjusting the drying time before the EBR process based on the degree of disturbance of the cut surface, instead of the function of adjusting the number of rinsing revolutions based on the cutting height in the first embodiment. Other functions such as the function of obtaining the degree of contamination from the imaging result of the wafer W and adjusting the cleaning time based on the degree of contamination thus obtained are similar to those in the first embodiment, in addition to the operation of determining the degree of disturbance of the cut surface, and therefore, a description thereof will be omitted.

For the adjustment of the drying time, the parameter adjustment program of the control part 100 has a function of determining whether or not the degree of disturbance of the cut surface obtained based on the imaging result of the wafer W is an allowable value, and if the degree of disturbance is not an allowable value, resetting the drying time before the EBR process based on the obtained degree of disturbance and a reference data of the degree of disturbance of the cut surface. The reference data refers to data indicating a relationship between the degree of disturbance of the cut surface and the drying time which are prepared in advance. In addition, the parameter adjustment program has a function of performing the application of the coating liquid, the drying and the EBR process on the wafer W for adjustment using the reset drying time by the coating module 2, and thereafter determining whether or not the degree of disturbance of the cut surface obtained from the imaging result is an allowable value in the same manner. Then, if the degree of disturbance is an allowable value, the parameter adjustment program has a function of storing the reset drying time in the storage part 102 as a parameter to be used at the time of processing the product wafer.

Furthermore, when the first series of operations and the second series of operations are completed and the third series of operations are performed, the parameter adjustment program is configured to use an actual data instead of the reference data for the resetting of the drying time. The actual data refers to data indicating a relationship between a degree of disturbance and a drying time of the cut surface, which are obtained from a first degree of disturbance and a first drying time of the cut surface acquired in the first series of operations and a second degree of disturbance and a second drying time of the cut surface acquired in the second series of operations.

Figure 22:
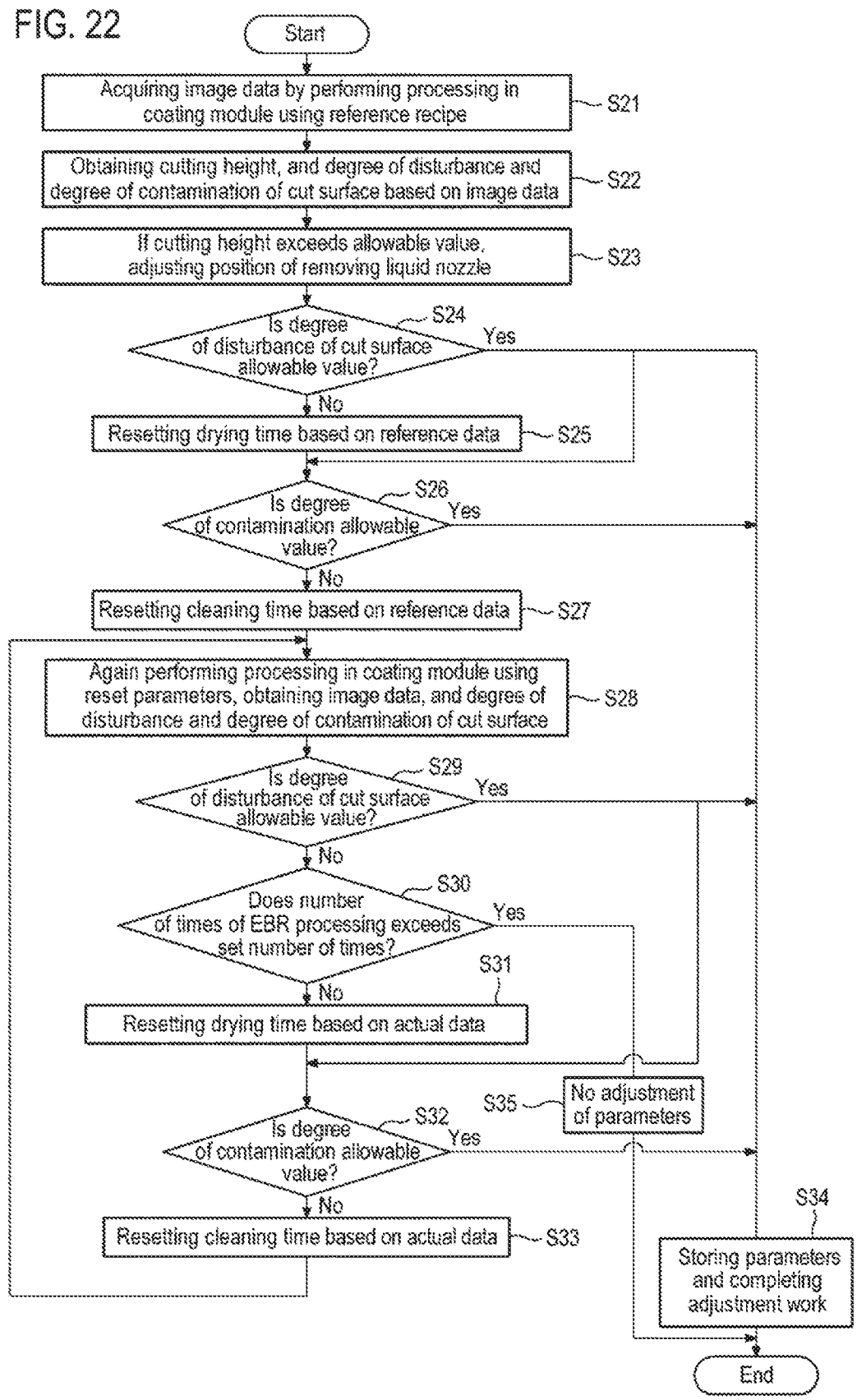
FIG. 22 is a flowchart illustrating an operation of the coating module according to the second embodiment.
Figure 23:
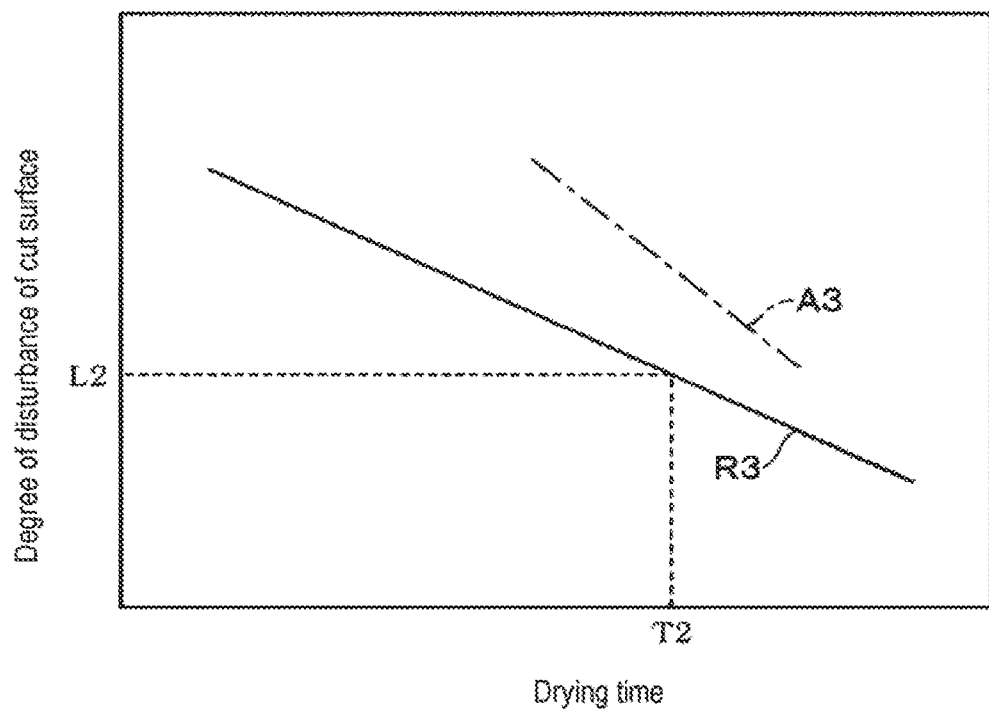
FIG. 23 is a characteristic diagram illustrating a reference data which indicates a relationship between a degree of disturbance and a drying time of a cut surface, and an actual data.

The automatic adjustment of the parameters in the present embodiment will be briefly described with reference to FIGS. 22 and 23, focusing on differences from the first embodiment. First, a coating module 2 for adjustment and a reference recipe stored in the storage part 102 are selected by the input part 105. For example, a reference data R3 indicating a relationship between the degree of disturbance and the drying time of the cut surface as illustrated in FIG. 23 and the reference data R2 (see FIG. 16) indicating a relationship between the degree of contamination and the cleaning time of the rear surface are stored in the reference recipe. By selecting the reference recipe, for example, an allowable value L2 of the degree of disturbance and a drying time T2 of the cut surface, an allowable value L1 of the degree of contamination and a cleaning time T1 are set.

Then, as described above, in the coating module 2, the coating liquid is applied on the wafer W for parameter adjustment, the wafer W is dried during the set drying time T2, the EBR process and the rear surface cleaning are performed during the set cleaning time. Subsequently, the wafer W is imaged by the imaging module 3 so that an image data of the peripheral region Wa, the beveled portion W0, and the rear surface We of the wafer W is acquired (step S21).

Subsequently, a cutting width, a degree of disturbance and a degree of contamination of the cut surface are obtained based on the image data (step S22). A discharge position (landing position of the removing liquid in the coating film) of the removing liquid from the removing liquid nozzle 26 is adjusted based on the cutting width (step S23). Then, it is determined whether or not the degree of disturbance of the cut surface is an allowable value (step S24). If the degree of disturbance is an allowable value, the process proceeds to steps S26 and S34. In step S34, the drying time T2 at this time is stored in the storage part 102 as a parameter to be used at the time of processing the product wafer, and the parameter adjustment operation of the drying time is terminated.

If the degree of disturbance is determined to exceed an allowable value, the process proceeds to step S25 where the drying time is reset to be lengthened based on the reference data R3. Thereafter, the process proceeds to step S26. In step S26, it is determined whether or not the degree of contamination is an allowable value. If the degree of contamination is an allowable value, the process proceeds to step S34 where the cleaning time T1 at this time is stored in the storage part 102 as a parameter to be used at the time of processing the product wafer. Then, the parameter adjustment operation of the cleaning time is terminated. On the other hand, if the degree of contamination is determined to exceed an allowable value, the cleaning time is reset to be lengthened based on the reference data R2 (step S27).

Subsequently, for example, with respect to another wafer W for parameter adjustment, the application of the coating liquid and the drying process at the reset drying time are performed by the coating module 2, and the EBR process and the rear surface cleaning at the reset cleaning time are performed. The imaging module 3 images the wafer W to acquire an image data, and obtains a degree of disturbance and a degree of contamination of the cut surface (step S28).

Then, in step S29, it is determined whether or not the degree of disturbance of the cut surface is an allowable value. If the degree of disturbance of the cut surface is an allowable value, the process proceeds to steps S32 and S34. In step S34, the drying time at this time is stored as a parameter for processing, and the adjustment operation of the drying time is terminated. If the degree of disturbance of the cut surface is determined to exceed an allowable value, the process proceeds to step S30 where it is determined whether or not the number of times of EBR process exceeds a set number of times. If the number of times of EBR process exceed is determined to exceed the set number of times, the process goes to step S35 where it is determined that the parameter adjustment is impossible. For example, such an impossible state is displayed on the display part 106 and the adjustment operation is terminated.

If the number of times of EBR process is determined to not exceed the set number of times in step S30, the process proceeds to step S31 where the drying time is reset. Thereafter, the process proceeds to step S32. The resetting in step S31 is performed based on the actual data A3 indicating a relationship between a degree of disturbance and a drying time of the cut surface, which is obtained from a first degree of disturbance and a first drying time of the cut surface acquired in the first series of operations and a second the degree of disturbance and a second drying time of the cut surface acquired in the second series of operations.

In step S32, it is determined whether or not the degree of contamination is an allowable value. If the degree of contamination is determined to be an allowable value, the process proceeds to step S34 where the cleaning time at this time is stored as a parameter for processing, and the adjustment operation of the cleaning time is terminated. On the other hand, if the degree of contamination is determined to exceed an allowable value, the process goes to step S33 where the cleaning time is reset. This resetting is performed based on an actual data indicating a relationship between a degree of contamination and a cleaning time, which is obtained from a first degree of contamination and a first cleaning time acquired in the first series of operations and a second degree of contamination and a second cleaning time acquired in the second series of operations.

Subsequently, for example, with respect to another wafer W for parameter adjustment, the application of the coating liquid and the drying process at the reset drying time are performed in the coating module 2, and the EBR process and the rear surface cleaning at the reset cleaning time are performed. The imaging module 3 images the wafer W to acquire an image data, and obtains a degree of disturbance and degree of contamination of the cut surface (step S28). In this manner, if the degree of disturbance of the cut surface exceeds an allowable value while the number of times of EBR process does not exceed the set number of times, the resetting of the drying time, the application of the coating liquid, the drying process and the EBR process are performed. Subsequently, a series of operations of obtaining a degree of disturbance of the cut surface and determining whether or not the degree of disturbance is an allowable value is repeated. Also, if the degree of contamination exceeds an allowable value while the number of times of EBR process does not exceed the set number of times, a series of operations of resetting the cleaning time, forming the coating film, performing the cleaning process, obtaining a degree of contamination, and determining whether or not the degree of contamination is an allowable value, is repeated.

According to the present embodiment, the wafer for adjustment processed by the coating module 2 is transferred to the imaging module 3 by the transfer mechanism 11. It is determined whether or not the degree of disturbance of the cut surface obtained based on the imaging result of the surface of the wafer for adjustment is an allowable value. If the degree of disturbance is determined to be not an allowable value, the drying time is reset based on the obtained degree of disturbance of the cut surface, and the reference data indicating a relationship between and the degree of disturbance of the cut surface and the drying time which are prepared in advance, and the process is again performed in the coating module 2. Thereafter, it is determined whether or not the degree of disturbance of the cut surface is an allowable value in the same manner. If the degree of disturbance of the cut surface is determined to be an allowable value, the reset drying time is stored in the storage part 102 as a parameter for processing. Thus, the drying time can be automatically adjusted, which facilitates the parameter adjustment.

Furthermore, when the first series of operations and the second series of operations are completed and the third series of operations are further performed, the resetting of the degree of disturbance of the cut surface is performed using the actual data instead of the reference data. Thus, the accuracy of the reset parameters is improved. Therefore, the time required for parameter adjustment is shortened and the parameter adjustment operation becomes easier.

Furthermore, it is determined whether or not the degree of contamination obtained based on the imaging result of the front surface of the wafer for adjustment is an allowable value. If the degree of contamination is determined to be not an allowable value, the cleaning time is reset based on the obtained degree of contamination and the reference data indicating a relationship between and the degree of contamination and the cleaning time which are prepared in advance. Thus, since the cleaning time can be automatically adjusted, it is possible to easily perform the parameter adjustment. Other effects are similar to those in the first embodiment.

In the above description, in the present embodiment, only the parameters relating to the degree of disturbance of the cut surface may be adjusted. That is to say, the control part 100 may be configured such that the surface of the wafer for adjustment processed by the coating module is imaged by the imaging module, only the degree of disturbance of the cut surface is obtained based on the imaging result, whether or not the obtained degree of disturbance of the cut surface is an allowable value is determined, and if the obtained degree of disturbance is determined to be not the allowable value, the drying time is reset based on the reference data. Further, the control part 100 may be configured such that the application of the coating liquid and the drying process at the reset drying time are again performed in the coating module, and subsequently the EBR process is performed. Thereafter, if it is determined whether or not the degree of disturbance of the cut surface is an allowable value in the same manner. If the degree of disturbance is determined to be an allowable value, the reset drying time is stored in the storage part 102 as a parameter to be used at the time of processing the product wafer.

While the control part 100 has been described to analyze the image data in the first embodiment and the second embodiment, a main control part for controlling the coating/developing apparatus 1 and a dedicated control part for controlling the imaging module 3 may be installed so that the analysis of the image data is performed by the dedicated control part. In this case, the main control part and the dedicated control part constitute the control part of the present disclosure. In the aforementioned embodiments, the plurality of wafers W for parameter adjustment is prepared. However, in a case where the parameters are reset and the process is again performed in the coating module 2, the coating film of the wafer W for parameter adjustment processed by the coating module 2 may be initially removed and subsequently the process may be again performed in the coating module 2. In the above, the imaging module is not limited to the aforementioned example. As an example, an imaging part configured to image the front surface of the wafer W may be installed separately.

Figure 24:
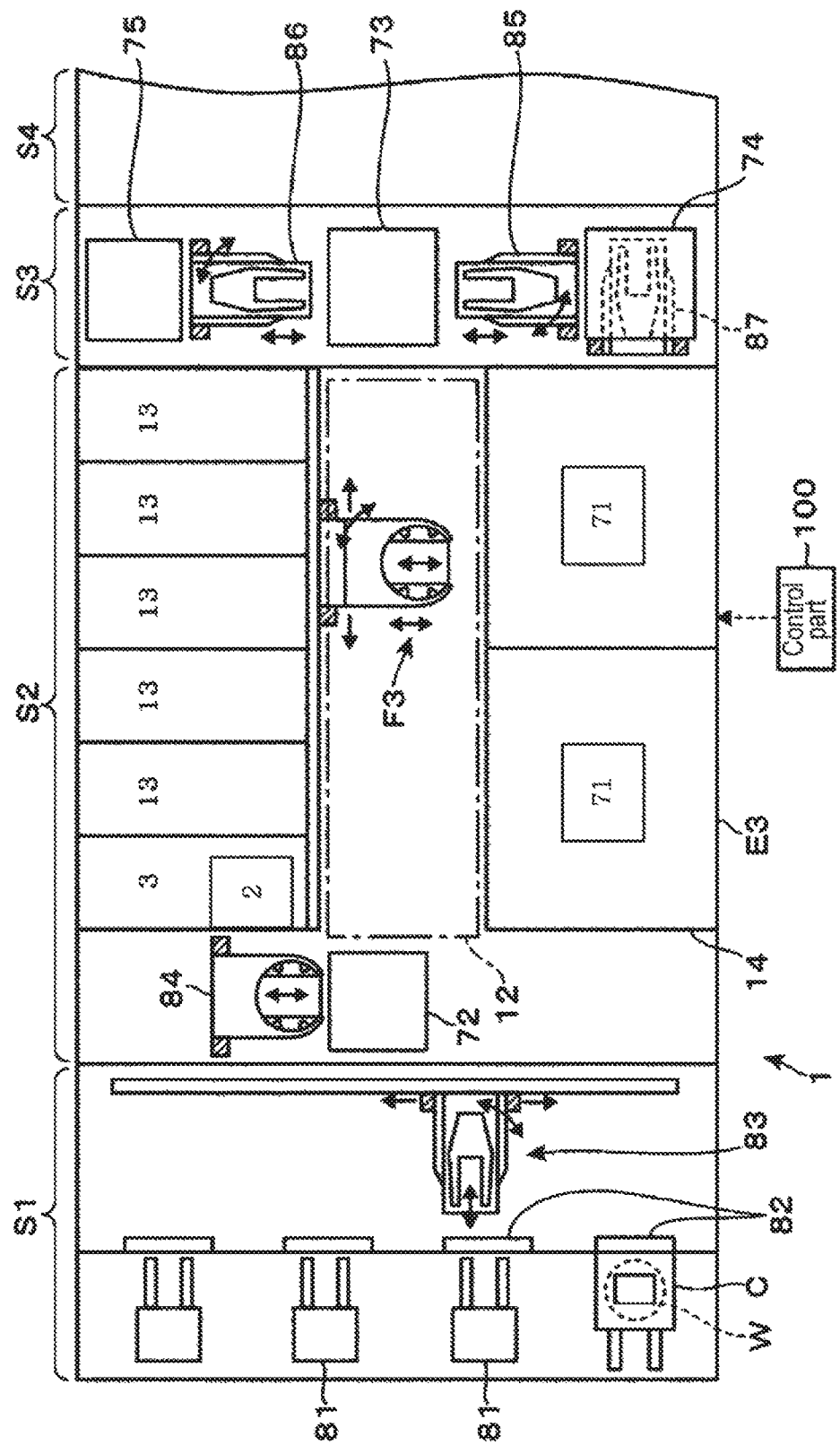
FIG. 24 is a plan view illustrating a coating/developing apparatus constituting the substrate processing apparatus.
Figure 25:
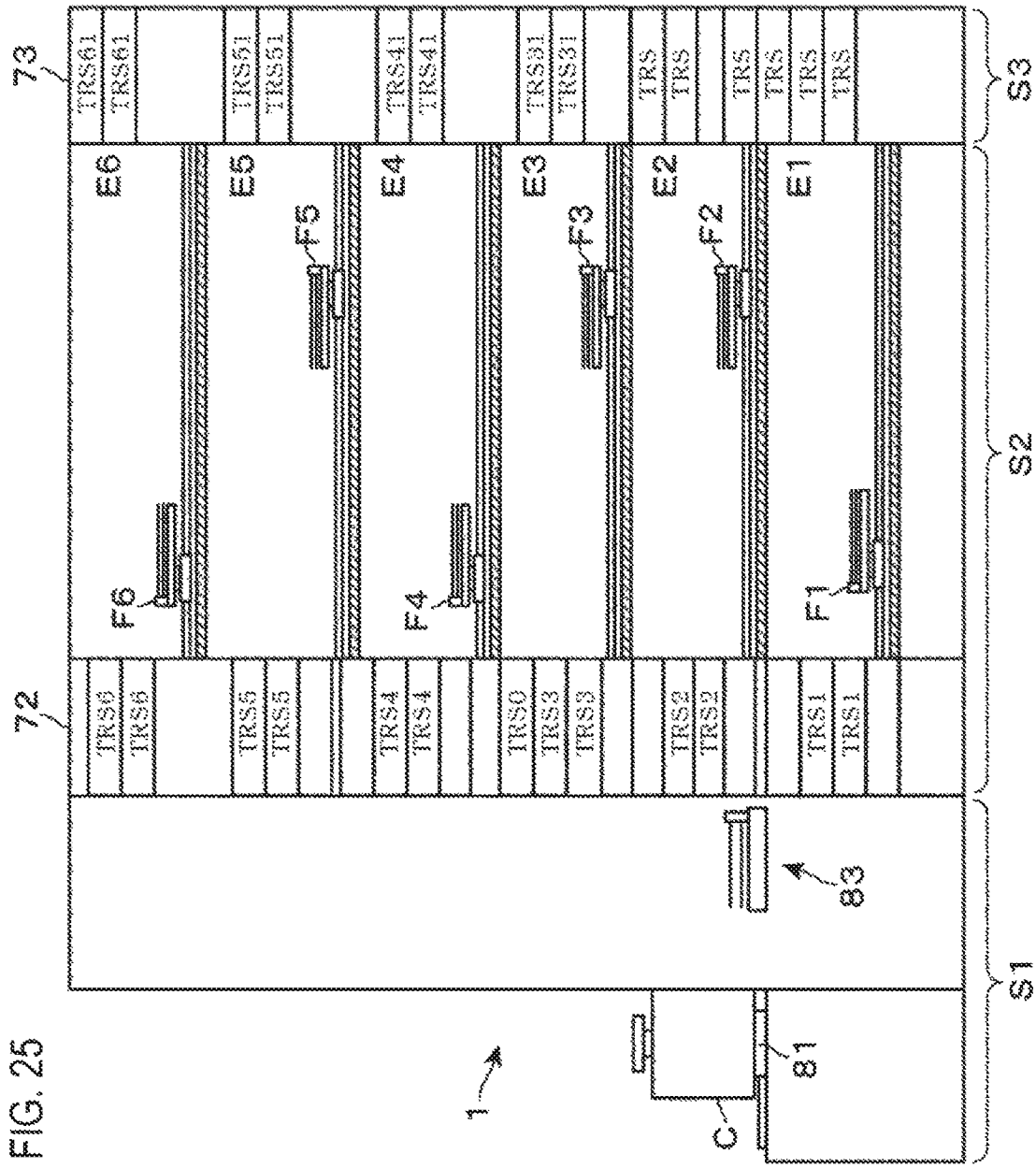
FIG. 25 is a longitudinal cross-sectional view illustrating the coating/developing apparatus.

Next, the overall configuration of the coating/developing apparatus 1 will be described with reference to a plan view of FIG. 24 and a longitudinal cross-sectional view of FIG. 25. The coating/developing apparatus 1 is configured by linearly connecting a carrier block S1 which constitutes a loading/unloading block, a processing block S2, and an interface block S3 in a lateral direction. In FIG. 24, reference symbol S4 is an exposure apparatus. A wafer W received in a transfer container C mounted on a mounting table 81 of the carrier block S1 is transferred from and to the processing block S2 by a transfer mechanism 83 via an opening/closing part 82.

The processing block S2 is configured by stacking unit blocks E1 to E6 that perform a liquid process on the wafer W sequentially from below. In these unit blocks E1 to E6, the transfer and the process of the wafer W are performed in parallel with each other. The unit blocks E1 and E2 are similar to each other in configuration, the unit books E3 and E4 are similar to each other in configuration, and the unit blocks E5 and E6 are similar to each other in configuration.

The coating module 2 and the imagining module 3 described above are installed in the unit blocks E3 and E4. FIG. 24 is the plan view of the unit blocks E3 and E4. The coating module 2 is installed at one side of a transfer path 12 of a transfer mechanism F3. The coating module 2 and the imaging module 3 which are described above, and heating modules 13 are installed on a shelf unit 71 installed at the other side of the transfer path 12.

The unit blocks E1, E2, E5 and E6 are similar to the unit blocks E3 and E4 in configuration except that liquid chemicals supplied to the water W are different from each other.

Each of the unit blocks E1 and E2 includes an anti-reflection film forming module configured to supply a liquid chemical for forming an anti-reflection film to the wafer W, instead of the coating module 2. Each of the unit blocks E5 and E6 includes a developing module configured to supply a developing solution as liquid chemical onto the wafer W to develop a resist film, instead of the coating module 2. In FIG. 25, transfer mechanisms of the unit blocks E1 to E6 are denoted as F1 to F6, respectively.

A tower 72 vertically extending across each of the unit blocks E1 to E6 and an elevatable transfer mechanism 84 for transferring the wafer W from and to the tower 72 are installed at the side of the carrier block S1 in the processing block S2. The tower 72 is configured by a plurality of modules stacked one above another, and includes transfer modules TRS on which the respective wafers W are mounted.

The interface block S3 includes towers 73, 74 and 75 which vertically extend across the unit blocks E1 to E6. The interface block S3 includes an elevatable transfer mechanism 85 for transferring the wafer W between the tower 73 and the tower 74, an elevatable transfer mechanism 86 for transferring the wafer W between the tower 73 and the tower 75, and a transfer mechanism 87 for transferring the wafer W between the tower 73 and the exposure apparatus S4.

The tower 73 is configured by stacking a transfer module TRS, a buffer module that stores and holds a plurality of wafers W before exposure processing, a buffer module that stores a plurality of wafers W after the exposure processing, and a temperature adjustment module for adjusting a temperature of the wafer W and the like, above one another. Illustration of the buffer module and the temperature adjustment module is omitted herein. In FIG. 1, the semiconductor wafer transfer mechanism 11 is shown as a transfer mechanism that also serves as the transfer mechanism 83 and the transfer mechanisms F3 and F4, and the transfer module and the like are omitted.

In a system including the coating/developing apparatus 1 and the exposure apparatus S4, a transfer route of the product wafer W will be briefly described. The wafer W is transferred from the transfer container C to a transfer module TRS0 of the tower 72 in the processing block S2 by the transfer mechanism 83. In the transfer module TRS0, the wafer W is allocated and transferred to the unit blocks E1 and E2.

The wafer W allocated in the transfer module TRS0 is transferred in the order of a transfer module TRS1 (TRS2) →the anti-reflection film forming module→the heating module→the transfer module TRS1 (TRS2). Subsequently, the wafer W is allocated to a transfer module TRS3 (TRS2) corresponding to the unit block E3 and a transfer module TRS4 corresponding to the unit block E4 by the transfer mechanism 84.

The wafer W allocated to the transfer modules TRS3 and TRS4 in this manner is transferred from the transfer module TRS3 (TRS4) to the unit block E3 (E4) where the wafer W is successively processed by the coating module 2 and the heating module 13. Thereafter, the wafer W is transferred to a transfer module TRS3 (TRS41) of the tower 73. Thereafter, the wafer W is loaded into the exposure apparatus S4 by the transfer mechanisms 85 and 87 via the tower 74. In the exposure apparatus S4, the resist film is exposed.

The wafers W after the exposure are transferred between the towers 73 and 75 by the transfer mechanisms 86 and 87, and are transferred to respective transfer modules TRS51 and TRS61 of the tower 73, which correspond to the unit blocks E5 and E6. Thereafter, the wafer W is transferred to the heating module where the wafer W is subjected to a so-called post exposure bake PEB. Subsequently, the wafer W is transferred to the developing module where the developing solution is supplied onto the wafer W to form a resist pattern. Thereafter, the wafer W is transferred to a transfer module TRS5 (TRS6) of the tower 72 and is then returned to the transfer container C via the transfer mechanism 83.

According to the present disclosure in some embodiments, a coating module and an imaging module are installed in a substrate processing apparatus. A semiconductor wafer for adjustment is processed by the coating module and subsequently, is transferred to the imaging module by a semiconductor wafer transfer mechanism. An outer end surface and a rear surface of the semiconductor wafer are imaged by the imaging module. Thereafter, based on the imaging result, a height dimension of an outer edge of a coating film with respect to an inner edge of a beveled portion of the semiconductor wafer is obtained. It is determined whether or not the height dimension is an allowable value. If the height dimension is determined to be not an allowable value, the number of revolutions of the semiconductor wafer is reset based on the obtained height dimension and a reference data indicating a relationship between the height dimension and the number of revolutions of the semiconductor wafer which are prepared in advance. Since the number of revolutions, which is a parameter of the coating module, is automatically adjusted in this manner, it is possible to easily adjust the parameter.

In addition, according to the present disclosure in some embodiments, a semiconductor wafer for adjustment processed by a coating module is transferred to an imaging module by a semiconductor wafer transfer mechanism. Based on the imaging result on a surface of the semiconductor wafer for adjustment, which is obtained by the imaging module, a degree of disturbance of a cut surface from an outer edge of a coating film to an inner edge of a beveled portion of the semiconductor water is obtained. Then, it is determined whether or not the obtained degree of disturbance is an allowable value. If the degree of disturbance is determined to be not an allowable value, a drying time is reset based on the obtained degree of disturbance and a reference data indicating a relationship between the degree of disturbance and a drying time taken for drying a coating film in order to remove the coating film in a peripheral portion of the semiconductor wafer, which are prepared in advance. Since the drying time, which is a parameter to be used for the process in the coating module, is automatically adjusted, it is possible to easily adjust the parameter.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for forming a coating film on a semiconductor wafer, comprising:
    a loading/unloading block into and from which a transfer container configured to accommodate a plurality of semiconductor wafers is loaded and unloaded;
    a coating module configured to apply a coating liquid to each of the plurality of semiconductor wafers taken out of the transfer container loaded into the loading/unloading block, and subsequently, in a state where the semiconductor wafer is rotated, discharge a removing liquid from a beveled portion film removing nozzle toward a beveled portion of the semiconductor wafer to remove the coating film formed on the beveled portion;
an imaging module including an imaging part configured to image the semiconductor wafer;
a semiconductor wafer transfer mechanism configured to transfer the semiconductor wafer between the coating module and the imaging module;
a storage part; and
a controller configured to: control the imaging module to image an outer end surface of a semiconductor wafer for a parameter adjustment, which is processed by the coating module; obtain a height dimension of an outer edge of the coating film with respect to an inner edge of the beveled portion of the semiconductor wafer based on an imaging result obtained by the imaging module; determine whether or not the obtained height dimension is a first allowable value; if the obtained height dimension is determined to be not the first allowable value, reset a new number of revolutions of the semiconductor wafer; control the coating module to again perform the application of the coating liquid onto the semiconductor wafer for the parameter adjustment and the removal of the coating film formed on the beveled portion; subsequently, determine whether the obtained height dimension is the first allowable value; and if the obtained height dimension is determined to be the first allowable value, store the reset number of revolutions of the semiconductor wafer in the storage part as a parameter for processing the semiconductor wafer as a product.

2. The substrate processing apparatus of claim 1, wherein when the new number of revolutions of the semiconductor wafer is reset, the controller performs a control to remove the coating film of the semiconductor wafer for the parameter adjustment, which has been processed by the coating module, and process the semiconductor wafer for the parameter adjustment again in the coating module.

3. The substrate processing apparatus of claim 2, wherein the controller resets the new number of revolutions of the semiconductor wafer based on the obtained height dimension and a first reference data indicating a relationship between a previously-prepared height dimension and a previously-prepared number of revolutions of the semiconductor wafer.

4. A substrate processing apparatus for forming a coating film on a semiconductor wafer, comprising:
a loading/unloading block into and from which a transfer container configured to accommodate a plurality of semiconductor wafers is loaded and unloaded;
at least one coating module configured to apply a coating liquid to each of the plurality of semiconductor wafers taken out of the transfer container loaded into the loading/unloading block, and subsequently, in a state where the semiconductor wafer is rotated, discharge a removing liquid from a peripheral portion film removing nozzle toward a front surface inward of a beveled portion of the semiconductor wafer to remove the coating film formed on the peripheral portion;
an imaging module including an imaging part configured to image the semiconductor wafer;
a semiconductor wafer transfer mechanism configured to transfer the semiconductor wafer between the at least one coating module and the imaging module;
a storage part; and
a controller configured to: control the imaging module to image the front surface of a semiconductor wafer for a parameter adjustment, which is processed by the at least one coating module; obtain a degree of disturbance of a cut surface from an outer edge of the coating film to an inner edge of the beveled portion of the semiconductor wafer based on an imaging result obtained by the imaging module; determine whether or not the obtained degree of disturbance of the cut surface is a first allowable value; if the obtained degree of disturbance of the cut surface is determined to be not the first allowable value, reset a new coating film drying time; control the at least one coating module to again perform the application of the coating liquid onto the semiconductor wafer for the parameter adjustment and the removal of the coating film formed on the peripheral portion; subsequently, determine whether or not the obtained degree of disturbance of the cut surface is the first allowable value; and if the obtained degree of disturbance of the cut surface is determined to be the first allowable value, store the reset coating film drying time in the storage part as a parameter for processing the semiconductor wafer as a product.

5. The substrate processing apparatus of claim 4, wherein when the new coating film drying time is reset, the controller performs a control to remove the coating film of the semiconductor wafer for the parameter adjustment, which has been processed by the coating module, and process the semiconductor wafer for the parameter adjustment again in the coating module.

6. The substrate processing apparatus of claim 5, wherein the controller resets the new coating film drying time based on the obtained degree of disturbance of the cut surface and a first reference data indicating a relationship between a previously-prepared degree of disturbance of the cut surface and a previously-prepared coating film drying time required to dry the coating film prior to removing the coating film formed on the peripheral portion.

7. The substrate processing apparatus of claim 6, wherein the at least one coating module includes a plurality of coating modules, the first reference data used in one coating module selected among the plurality of coating modules is used as an actual data already obtained by another coating module selected among the plurality of coating modules, for the same type of coating film as the coating film formed by the one coating module.

8. A method of adjusting a parameter during processing of a coating module in a substrate processing apparatus for forming a coating film on a semiconductor wafer,
wherein the apparatus includes:
a loading/unloading block into and from which a transfer container configured to accommodate a plurality of semiconductor wafers is loaded and unloaded;
a coating module configured to apply a coating liquid to each of the plurality of semiconductor wafers taken out of the transfer container loaded into the loading/unloading block, and subsequently, in a state where the semiconductor wafer is rotated, discharge a removing liquid from a beveled portion film removing nozzle toward a beveled portion of the semiconductor wafer to remove the coating film formed on the beveled portion;
an imaging module including an imaging part configured to image the semiconductor wafer;
a semiconductor wafer transfer mechanism configured to transfer the semiconductor wafer between the coating module and the imaging module; and a storage part,
the method comprising:
imaging, by the imaging module, an outer end surface of a semiconductor wafer for a parameter adjustment, which is processed by the coating module;
obtaining a height dimension of an outer edge of the coating film with respect to an inner edge of the beveled portion of the semiconductor wafer based on an imaging result obtained by the imaging module;
determining whether or not the obtained height dimension is a first allowable value;
if the obtained height dimension is determined to be not the first allowable value, resetting a new number of revolutions of the semiconductor wafer;
controlling the coating module to again perform the application of the coating liquid onto the semiconductor wafer for the parameter adjustment and the removal of the coating film formed on the beveled portion;
subsequently, determining whether or not the obtained height dimension is the first allowable value; and
if the obtained height dimension is determined to be the first allowable value, storing the reset number of revolutions of the semiconductor wafer in the storage part as the parameter for processing the semiconductor wafer as a product.

9. The method of claim 8, further comprising: when the new number of revolutions of the semiconductor wafer is reset, controlling the coating module to remove the coating film of the semiconductor wafer for the parameter adjustment, which has been processed by the coating module, and process the semiconductor wafer for the parameter adjustment again in the coating module.

10. The method of claim 9, wherein in the resetting the new number of revolutions, the new number of revolutions of the semiconductor wafer is reset based on the obtained height dimension and a first reference data indicating a relationship between a previously-prepared height dimension and a previously-prepared number of revolutions of the semiconductor wafer.

11. A non-transitory computer-readable recording medium storing a computer program for use in a substrate processing apparatus for forming a coating film on a semiconductor wafer, the apparatus comprising: a loading/unloading block into and from which a transfer container configured to accommodate a plurality of semiconductor wafers is loaded and unloaded; a coating module configured to apply a coating liquid to each of the plurality of semiconductor wafers taken out of the transfer container loaded into the loading/unloading block; an imaging module including an imaging part configured to image the semiconductor wafer; and a semiconductor wafer transfer mechanism configured to transfer the semiconductor wafer between the coating module and the imaging module,
wherein the computer program includes a group of steps for executing the method of claim 8.

12. A method of adjusting a parameter during processing of a coating module in a substrate processing apparatus for forming a coating film on a semiconductor wafer,
wherein the apparatus includes:
a loading/unloading block into and from which a transfer container configured to accommodate a plurality of semiconductor wafers is loaded and unloaded;
at least one coating module configured to apply a coating liquid to each of the plurality of semiconductor wafers taken out of the transfer container loaded into the loading/unloading block, and subsequently, in a state where the semiconductor wafer is rotated, discharge a removing liquid from a peripheral portion film removing nozzle toward a front surface inward of a beveled portion of the semiconductor wafer to remove the coating film formed on the peripheral portion;
an imaging module including an imaging part configured to image the semiconductor wafer;
a semiconductor wafer transfer mechanism configured to transfer the semiconductor wafer between the at least one coating module and the imaging module; and
a storage part,
the method comprising:
controlling the imaging module to image the front surface of a semiconductor wafer for a parameter adjustment, which is processed by the at least one coating module;
obtaining a degree of disturbance of a cut surface from an outer edge of the coating film to an inner edge of the beveled portion of the semiconductor wafer based on an imaging result obtained by the imaging module;
determining whether or not the obtained degree of disturbance of the cut surface is a first allowable value;
if the obtained degree of disturbance of the cut surface is determined to be not the first allowable value, resetting a new coating film drying time;
controlling the at least one coating module to again perform the application of the coating liquid onto the semiconductor wafer for the parameter adjustment and the removal of the coating film formed on the peripheral portion;
subsequently, determining whether or not the obtained degree of disturbance of the cut surface is the first allowable value; and
if the obtained degree of disturbance of the cut surface is determined to be the first allowable value, storing the reset coating film drying time in the storage part as the parameter for processing the semiconductor wafer as a product.

13. The method of claim 12, further comprising: when the new coating film drying time is reset, controlling the coating module to remove the coating film of the semiconductor wafer for the parameter adjustment, which has been processed by the coating module, and process the semiconductor wafer for the parameter adjustment again in the coating module.

14. The method of claim 13, in the resetting the new coating film drying time, the new coating film drying time is reset based on the obtained degree of disturbance of the cut surface and a first reference data indicating a relationship between a previously-prepared degree of disturbance of the cut surface and a previously-prepared coating film drying time required to dry the coating film prior to removing the coating film formed on the peripheral portion.

15. The method of claim 14, wherein the at least one coating module includes a plurality of coating modules, the first reference data used in one coating module selected among the plurality of coating modules is used as an actual data already obtained by another coating module selected among the plurality of coating modules, for the same type of coating film as the coating film formed by the one coating module.

16. A non-transitory computer-readable recording medium storing a computer program for use in a substrate processing apparatus for forming a coating film on a semiconductor wafer, the apparatus comprising: a loading/unloading block into and from which a transfer container configured to accommodate a plurality of semiconductor wafers is loaded and unloaded; a coating module configured to apply a coating liquid to each of the plurality of semiconductor wafers taken out of the transfer container loaded into the loading/unloading block; an imaging module including an imaging part configured to image the semiconductor wafer; and a semiconductor wafer transfer mechanism configured to transfer the semiconductor wafer between the coating module and the imaging module, wherein the computer program includes a group of steps for executing the method of claim 12.

\* \* \* \* \*